US011006541B2

(12) United States Patent
Hatori et al.

(10) Patent No.: US 11,006,541 B2
(45) Date of Patent: May 11, 2021

(54) HOUSING, ELECTRONIC DEVICE, AND METHOD FOR MANUFACTURING HOUSING

(71) Applicant: Panasonic Intellectual Property Management Co., Ltd., Osaka (JP)

(72) Inventors: Fumitsugu Hatori, Kanagawa (JP); Tomoya Okuzumi, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 100 days.

(21) Appl. No.: 16/458,238

(22) Filed: Jul. 1, 2019

(65) Prior Publication Data
US 2019/0327847 A1 Oct. 24, 2019

Related U.S. Application Data

(63) Continuation of application No. PCT/JP2017/045244, filed on Dec. 18, 2017.

(30) Foreign Application Priority Data

Feb. 28, 2017 (JP) .............................. JP2017-035865
Nov. 1, 2017 (JP) .............................. JP2017-211628

(51) Int. Cl.
*H05K 1/00* (2006.01)
*H05K 1/18* (2006.01)
*H05K 7/00* (2006.01)
*H05K 7/14* (2006.01)
(Continued)

(52) U.S. Cl.
CPC ............. *H05K 7/1427* (2013.01); *B21D 5/00* (2013.01); *H05K 1/181* (2013.01); *H05K 5/02* (2013.01)

(58) Field of Classification Search
CPC ........ H05K 7/1427; H05K 1/181; H05K 5/02; H05K 5/0013; H05K 5/0008; B21D 5/00; B21D 51/52
See application file for complete search history.

(56) References Cited

U.S. PATENT DOCUMENTS 8,351,211 B2 * 1/2013 Maeda ............... H05K 7/20509
361/752
2004/0034994 A1 * 2/2004 Chang ................... H05K 7/142
29/760
2004/0062943 A1 4/2004 Naritomi et al.
(Continued)

FOREIGN PATENT DOCUMENTS

JP 55-123197 9/1980
JP 1-214200 8/1989
(Continued)

OTHER PUBLICATIONS

International Search Report of PCT application No. PCT/JP2017/045244 dated Mar. 13, 2018.

*Primary Examiner* — Yuriy Semenenko
(74) *Attorney, Agent, or Firm* — Greenblum & Bernstein, P.L.C.

(57) ABSTRACT

A housing is formed by bending a metal plate including a molded plastic part. The molded plastic part includes a perimeter portion formed along an outer peripheral edge of the metal plate, and a bent part formed in a bending area in which the metal plate is bent. The bent part is provided with a notch formed along the bending area.

7 Claims, 21 Drawing Sheets

(51) Int. Cl.
   *B21D 5/00*      (2006.01)
   *H05K 5/02*      (2006.01)

(56)  References Cited

U.S. PATENT DOCUMENTS

| | | | | |
|---|---|---|---|---|
| 2006/0114662 A1* | 6/2006 | Liu | ............... | H05K 7/142 |
| | | | | 361/759 |
| 2008/0137281 A1* | 6/2008 | Chen | ............... | G11B 33/123 |
| | | | | 361/679.33 |
| 2009/0073651 A1* | 3/2009 | Hu | ............... | H05K 7/1487 |
| | | | | 361/679.58 |
| 2009/0081390 A1* | 3/2009 | Chen | ............... | F16B 37/122 |
| | | | | 428/34.1 |
| 2013/0270699 A1* | 10/2013 | Kuo | ............... | H01L 23/49816 |
| | | | | 257/738 |

FOREIGN PATENT DOCUMENTS

| | | |
|---|---|---|
| JP | 8-274483 | 10/1996 |
| JP | 10-296337 | 11/1998 |
| JP | 2003-103563 | 4/2003 |
| JP | 2003-200453 | 7/2003 |
| JP | 2004-040945 | 2/2004 |
| JP | 2006-297929 | 11/2006 |
| JP | 2010-131781 | 6/2010 |
| JP | 2012-125931 | 7/2012 |
| JP | 2016-103521 | 6/2016 |
| JP | 2016103521 | * 6/2016 |

\* cited by examiner

HOUSING, ELECTRONIC DEVICE, AND METHOD FOR MANUFACTURING HOUSING

CROSS-REFERENCE TO RELATED APPLICATIONS

This application is a continuation of the PCT International Application No. PCT/JP2017/045244 filed on Dec. 18, 2017, which claims the benefit of foreign priority of Japanese patent application No. 2017-035865 and No. 2017-211628 filed on Feb. 28, 2017 and Dec. 1, 2017, respectively, the contents all of which are incorporated herein by reference.

BACKGROUND

1. Technical Field

The present disclosure relates to a structure of a housing, and more particularly, to a housing formed by bending a plate-shaped member, an electronic device including the housing, and a method for manufacturing the housing.

2. Description of the Related Art

A known electronic device housing is formed from a synthetic resin flat plate provided with screw holes for mounting electronic components by a bending process (see, for example, Japanese Patent Unexamined Publication No. S55-123197). Another known electronic device housing is formed from a plate member in which a metal plate and a polymer material are layered (see, for example, Japanese Patent Unexamined Publication No. 1108-274483). A known method of insert molding involves filling a molten resin into a cavity and inserting an attachment component therein (for example, see Japanese Patent Unexamined Publication Nos. 2004-040945, 2010-131781, and 2012-125931).

SUMMARY

One aspect of the present disclosure provides a housing formed by bending a metal plate including a molded plastic part. The molded plastic part includes a perimeter portion which is located along an outer peripheral edge of the metal plate, and a bent part which is located in a region including a bending area at which the metal plate is bent. The bent part is provided with a notch located along the bending area.

The present disclosure makes it possible to provide a housing that provides sufficient strength and also achieves weight reduction.

DETAILED DESCRIPTION OF PREFERRED EMBODIMENTS

Figure 1:
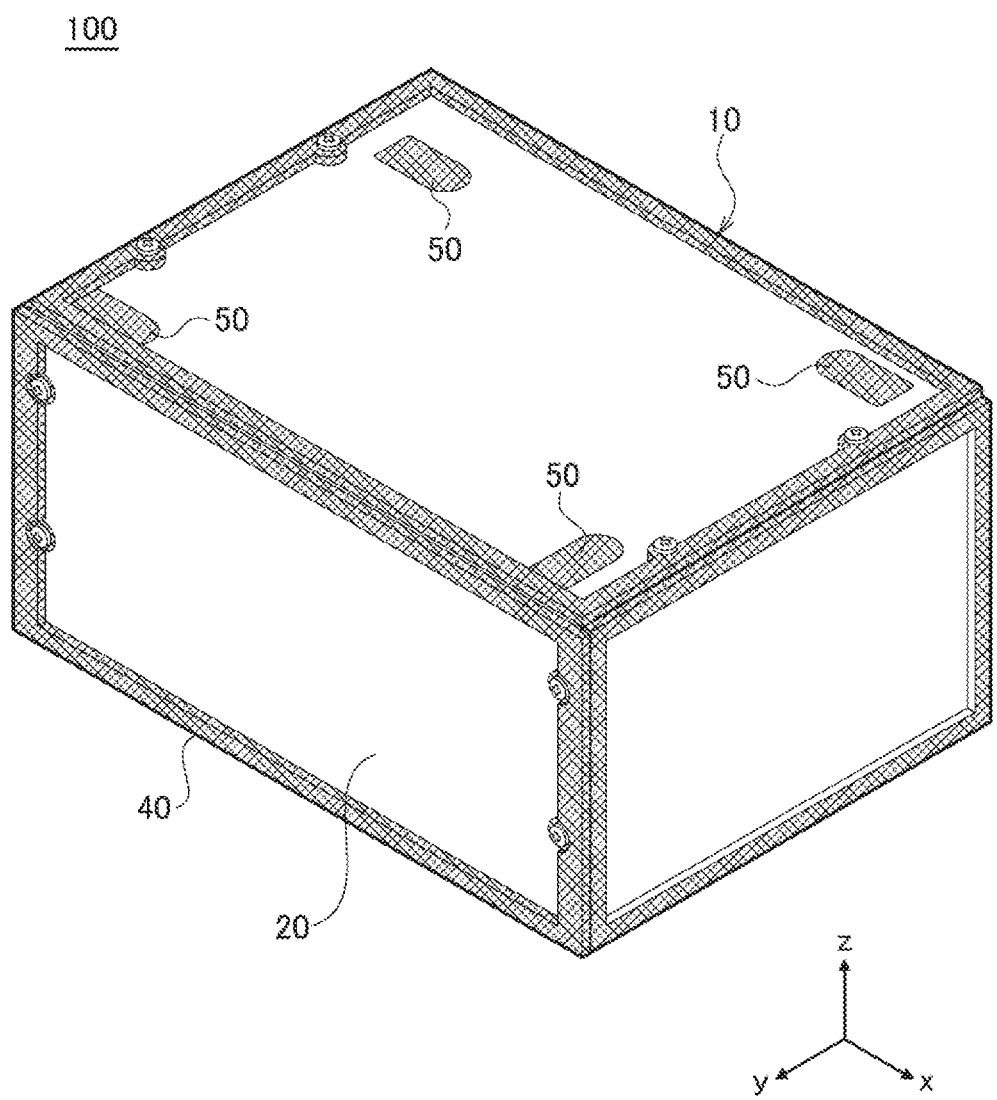
FIG. 1 is a perspective view illustrating an electronic device according to a first exemplary embodiment of the present disclosure.

Housings for electronic devices need to have a structure that provides sufficient strength to protect enclosed electronic components from impact and pressure while achieving weight reduction. In this respect, there remains room for improvement in the housings according to the cited references.

The present disclosure has been made in view of the foregoing problems, and it is an object of the disclosure to provide a housing that provides sufficient strength and also makes weight reduction.

In the following description, same or similar elements are designated by the same reference signs in various exemplary embodiments, and the description of such same or similar elements will not be repeated. In the drawings, some of the constituent elements may be omitted for convenience in illustration.

Although the terms containing ordinal numbers, such as "first", "second", and so forth, are used to describe various constituent elements, such terms are used merely to distinguish one element from another and should not be construed to limit any constituent element.

Prior to describing exemplary embodiments of the present disclosure in detail, an outline will be described. The exemplary embodiments relate to a housing that encloses electronic components and an electronic device that includes the housing. An example of the electronic device is an on-board device. Housings for electronic devices need to provide sufficient strength to protect enclosed electronic components from impact and pressure while achieving weight reduction. In particular, housings for on-board devices require weight reduction in order to meet increasingly stricter vehicle regulations concerning fuel consumption and $CO_2$ emissions. Housings also require noise suppression for electronic components and reduction in manufacturing costs. Each of the exemplary embodiments of the present disclosure will describe a structure of housings that improves these points.

In the following description, the terms "parallel" and "perpendicular" are meant to include cases where an element is slightly off from parallel or perpendicular to the reference line within error tolerance, not just cases where the element is perfectly parallel or perpendicular thereto. The terms "about" and "substantially" as used herein may mean a reasonable amount of deviation of the modified term.

First Exemplary Embodiment

The structure of housing 10 according to a first exemplary embodiment will be described with reference to FIGS. 1 to 6. Housing 10 is included in electronic device 100. The structure of housing 10 will be described. As shown in the drawings, a rectangular coordinate system including the x-axis, the y-axis, and the z-axis is defined. The x-axis and the y-axis are orthogonal to each other within a bottom face of housing 10. The z-axis extends orthogonally to the x-axis and the y-axis. The respective positive directions of the x-axis, the y-axis, and the z-axis are defined by the directions indicated by the arrows in the drawings, and the negative directions thereof are defined by the directions opposite to those indicated by the arrows. The positive direction end of the x-axis may also be referred to as "right end", and the negative direction end of the x-axis may also be referred to as "left end". The positive direction end of the y-axis may also be referred to as "forward end" or "front", and the negative direction end of the y-axis may also be referred to as "rear end" or "back". The positive direction end of the z-axis may also be referred to as "upward end" or "top", and the negative direction end of the z-axis may also be referred to as "downward end" or "bottom".

FIG. 1 is a perspective view illustrating electronic device 100 according to the first exemplary embodiment of the present disclosure. Electronic device 100 includes housing 10 for enclosing an electronic device. Housing 10 is formed by bending metal plate 20 including molded plastic part 40. In each of the drawings, the hatched portion in which left slanting lines and right slanting lines intersect each other represents molded plastic part 40.

Figure 2:
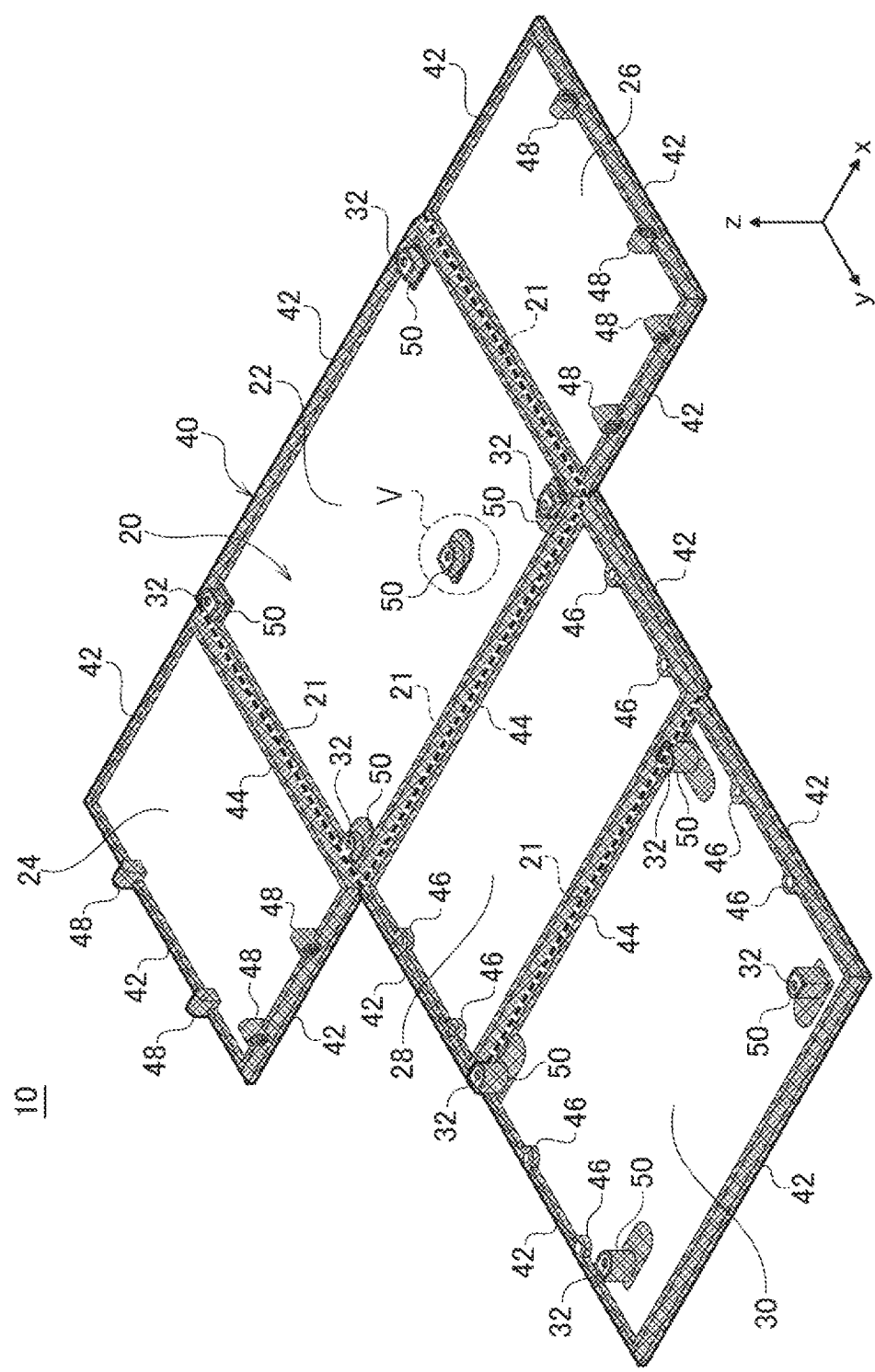
FIG. 2 is a perspective view illustrating a developed housing according to the first exemplary embodiment of the present disclosure.
Figure 3:
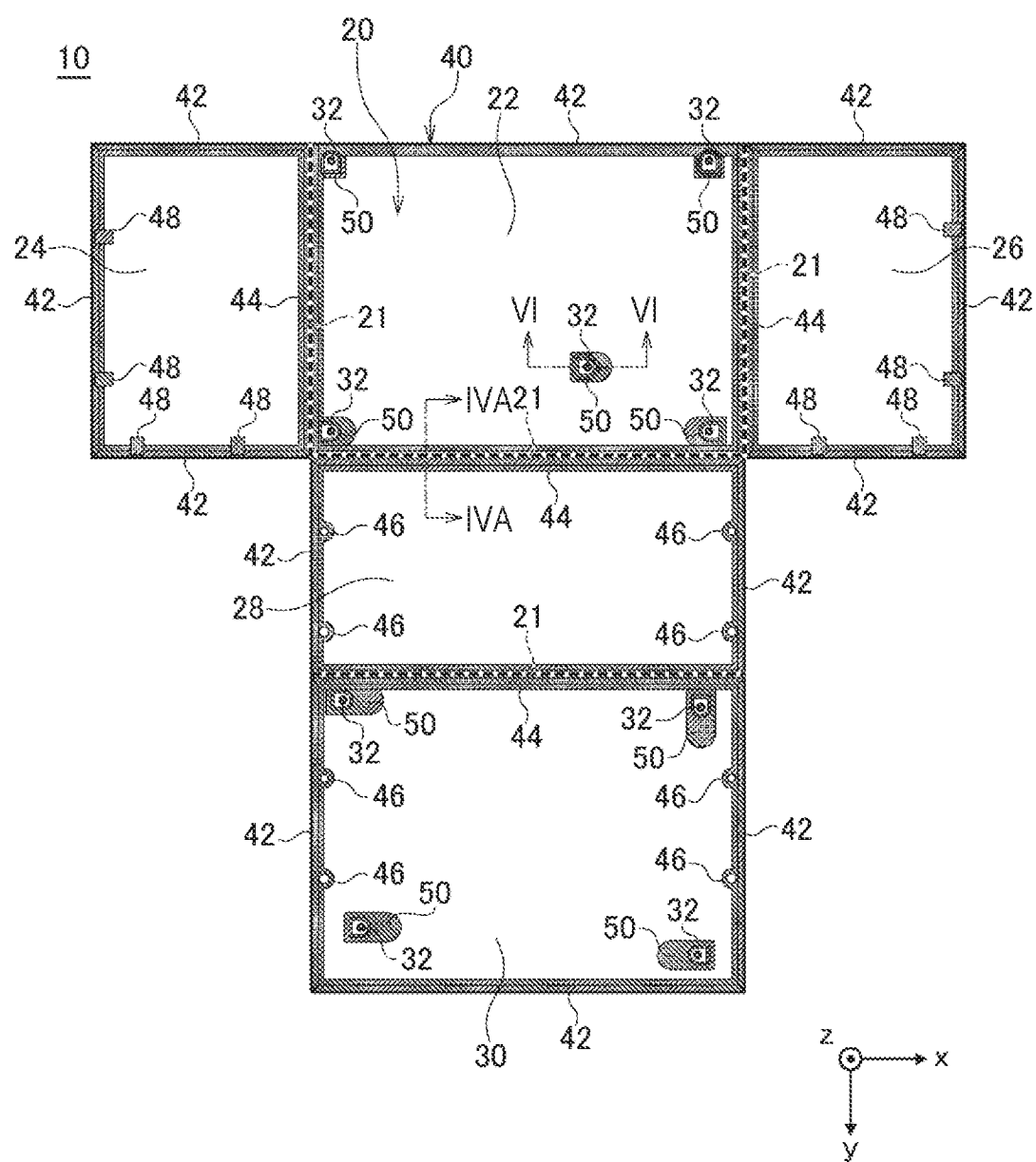
FIG. 3 is a plan view illustrating the developed housing according to the first exemplary embodiment of the present disclosure.

FIG. 2 is a perspective view illustrating developed housing 10 according to the first exemplary embodiment of the present disclosure, and FIG. 3 is a plan view thereof. Metal plate 20 is a single flat plate member formed of an aluminum alloy, an iron alloy, or the like, and includes bottom face portion 22, left-side face portion 24, right-side face portion 26, front face portion 28, and top face portion 30. Metal plate 20 is bent along bending areas 21, each of which is a boundary between the foregoing portions. Bottom face portion 22 and top face portion 30 are provided with later-described printed circuit board (PCB) contact parts 32.

Molded plastic part 40 is formed of polypropylene, nylon, PBT, or the like, and it is formed on both sides of metal plate 20 by a known method such as outsert molding. Molded plastic part 40 includes perimeter portion 42, bent part 44, and substrate-securing portion 50.

Perimeter portion 42 is formed along an outer peripheral edge of metal plate 20. Perimeter portion 42 is provided with housing screw hole portions 46 or housing screw retainer portions 48 located on respective two sides of perimeter portion 42 that are brought into contact with each other when metal plate 20 is bent. When bent at bending areas 21, metal plate 20 is secured by screws each of which is fastened to housing screw retainer portion 48 through housing screw hole portion 46.

Figure 4A:
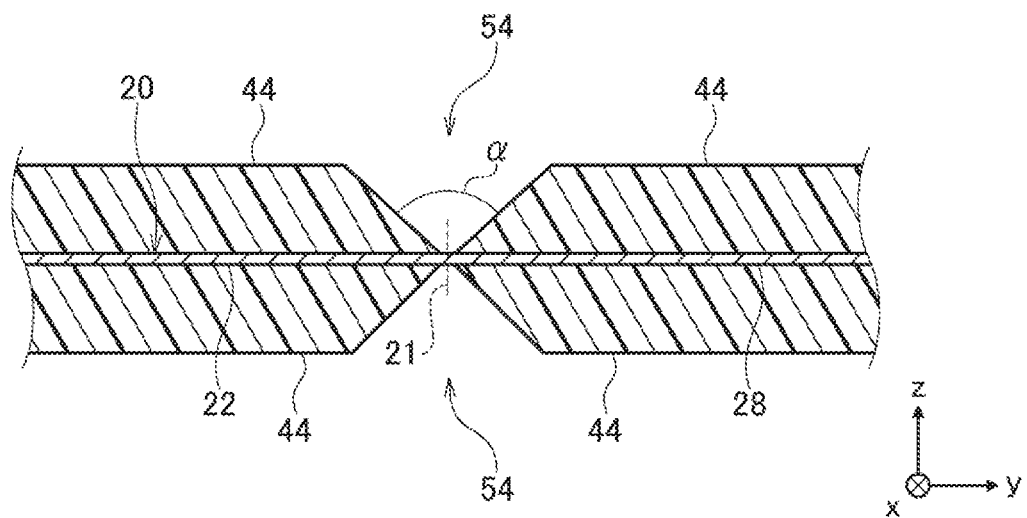
FIG. 4A is a cross-sectional view taken along line IVA-IVA in FIG. 3.

Bent part 44 is formed in a region including bending area 21. FIG. 4A is a partially enlarged view showing the cross section taken along line IVA-IVA in FIG. 3. Bent parts 44 are formed on both sides of metal plate 20, and notches 54 are provided along bending area 21. Each of notches 54 is formed in a V-shape with a width thereof increasing away from metal plate 20. Metal plate 20 is exposed in bending area 21.

Figure 4B:
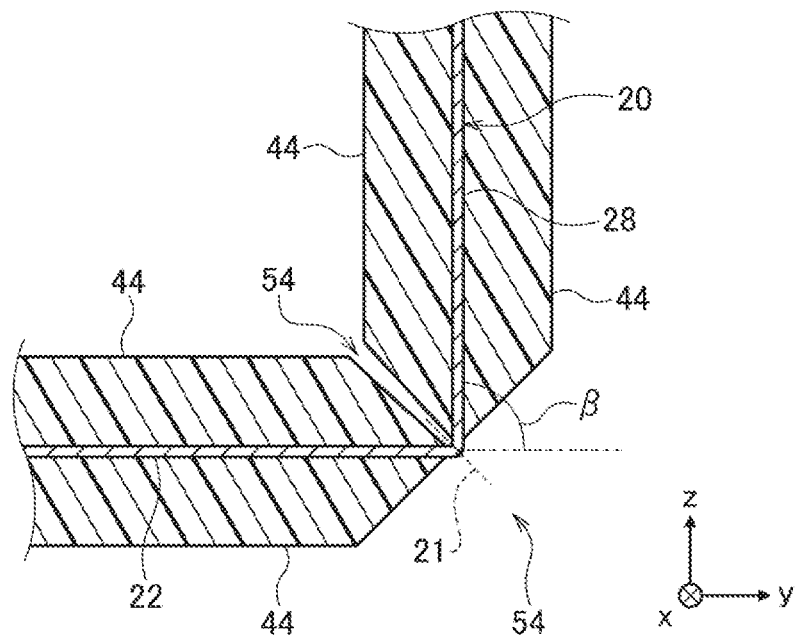
FIG. 4B is a cross-sectional view illustrating a metal plate after the metal plate has been bent from the condition shown in FIG. 4A.

FIG. 4B is a view illustrating metal plate 20 that has been bent. Metal plate 20 is bent at bending area 21 so that front face portion 28 is perpendicular to bottom face portion 22. Because molded plastic parts 40 are formed to reinforce metal plate 20, metal plate 20 can be made thinner to a thickness such that it can be bent with a hand. Also, notch 54 formed in bent part 44 allows metal plate 20 to be bent easily along bending area 21. Moreover, because metal plate 20 is exposed along bending area 21, metal plate 20 can be bent more easily. Angle α of notch 54 shown in FIG. 4A is set to substantially the same angle as bending angle β shown in FIG. 4B. This prevents metal plate 20 from being bent excessively. Such a configuration allows the assembly work of bending metal plate 20 at bending area 21 to a predetermined angle to be easily carried out manually without using a processing machine.

Although the description is made with reference to the drawings that show the portion that is formed in a region including bending area 21 between bottom face portion 22 and front face portion 28 of metal plate 20, other bent parts 44 also have the same structure.

Figure 5:
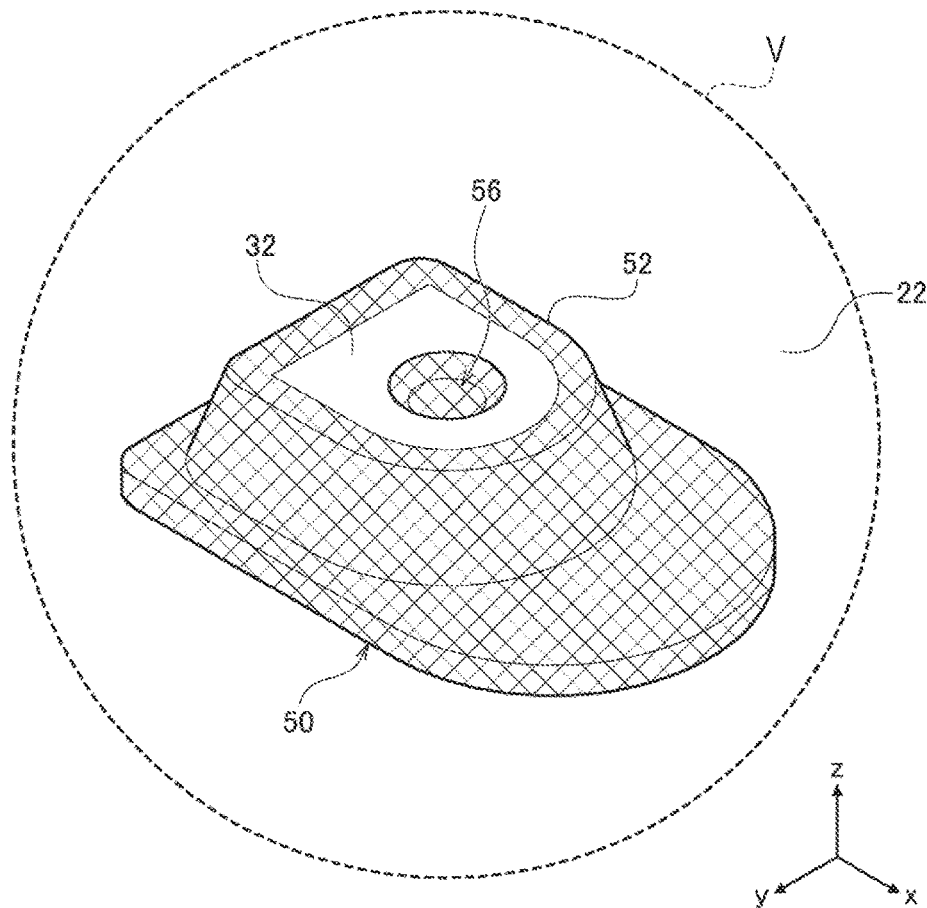
FIG. 5 is an enlarged view of a portion V in FIG. 2.
Figure 6:
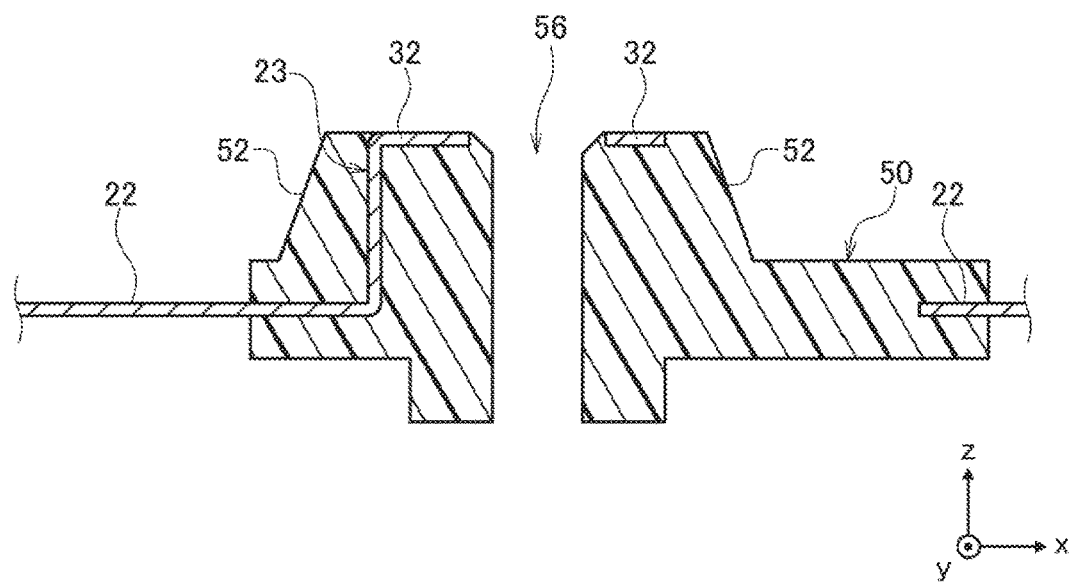
FIG. 6 is a cross-sectional view taken along line VI-VI in FIG. 3.
Figure 7:
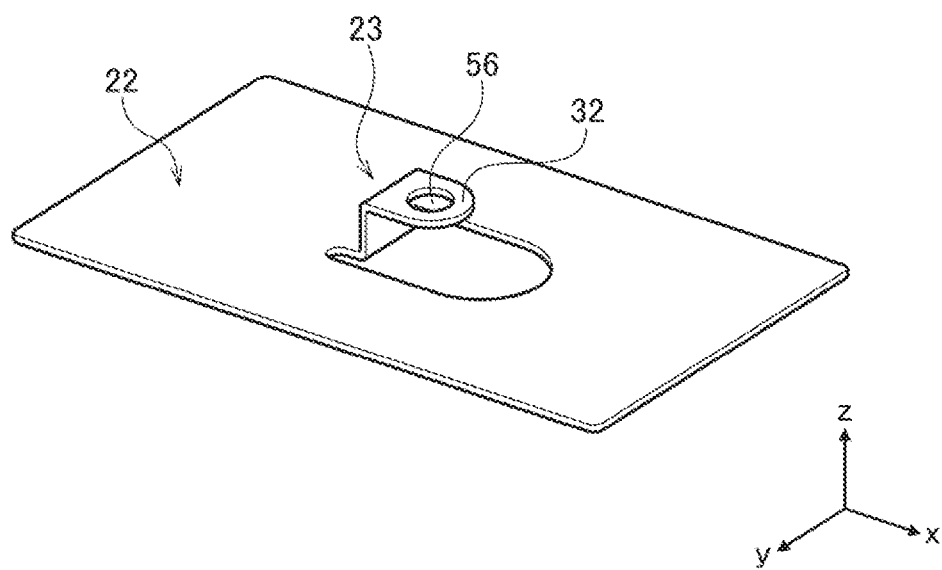
FIG. 7 is a perspective view illustrating a pierced-and-bent piece and a region around the pierced-and-bent piece shown in FIG. 6.

With reference to FIGS. 5, 6, and 7, the structure of PCB contact parts 32 of metal plate 20 and the structure of substrate-securing portions 50 of molded plastic part 40 will be described below. FIG. 5 is an enlarged view of a portion V in FIG. 2, and FIG. 6 is a cross-sectional view taken along line VI-VI in FIG. 3. FIG. 7 is a perspective view illustrating pierced-and-bent piece 23 and a region around pierced-and-bent piece 23. Pierced-and-bent piece 23 may be formed in, for example, a process of presswork for forming metal plate 20. Pierced-and-bent piece 23, which includes PCB contact part 32, and substrate-securing portion 50 are formed integrally with each other by a conventionally known method, such as insert molding.

Substrate-securing portion 50 includes protruding portion 52 and substrate screw hole 56. Protruding portion 52 is formed in a columnar shape extending upward parallel to the z-axis from the surface of metal plate 20. A screw that penetrates through protruding portion 52 for securing a substrate (i.e. a circuit board) on which electronic components are mounted is fitted into substrate screw hole 56. Pierced-and-bent piece 23, shown in FIG. 6, is formed so as to extend upward parallel to the z-axis through protruding portion 52 of substrate-securing portion 50, then bend along the upper surface of protruding portion 52, and extend in a direction parallel to the x-axis. PCB contact part 32 is a part of pierced-and-bent piece 23 and is exposed on the upper surface end of protruding portion 52. PCB contact part 32 is provided with a screw hole corresponding to substrate screw hole 56. The upper surface of PCB contact part 32 is exposed from protruding portion 52 so as to be in contact with a substrate that is to be secured to substrate-securing portion 50. Although portion V in FIG. 2 has been described with reference to the drawings, the other of PCB contact parts 32 and the other of substrate-securing portions 50 also have the same structure.

Figure 8:
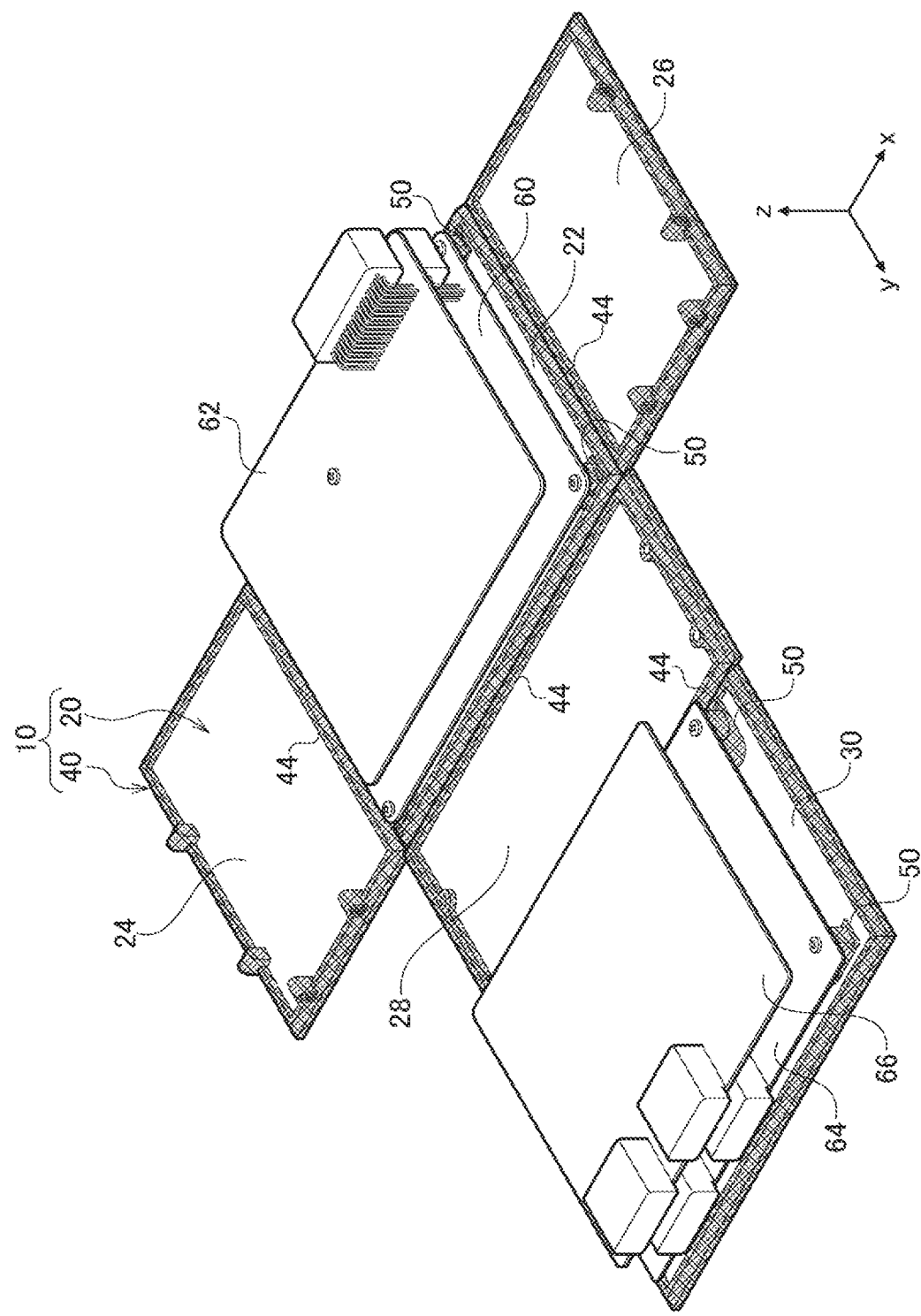
FIG. 8 is a perspective view illustrating a housing of FIG. 2 on which substrates are mounted.
Figure 9:
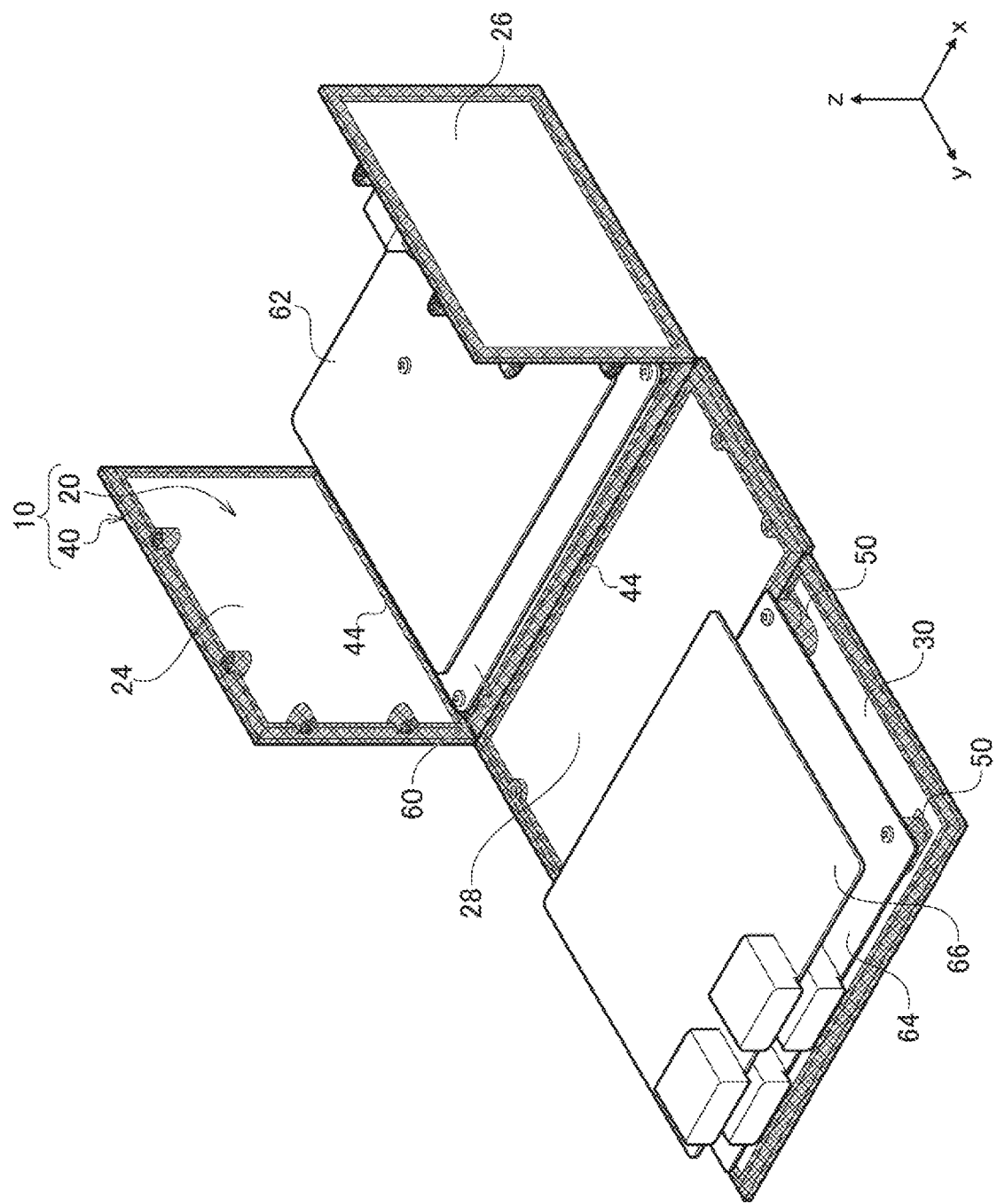
FIG. 9 is a perspective view illustrating the housing of FIG. 8 that has been bent.
Figure 10:
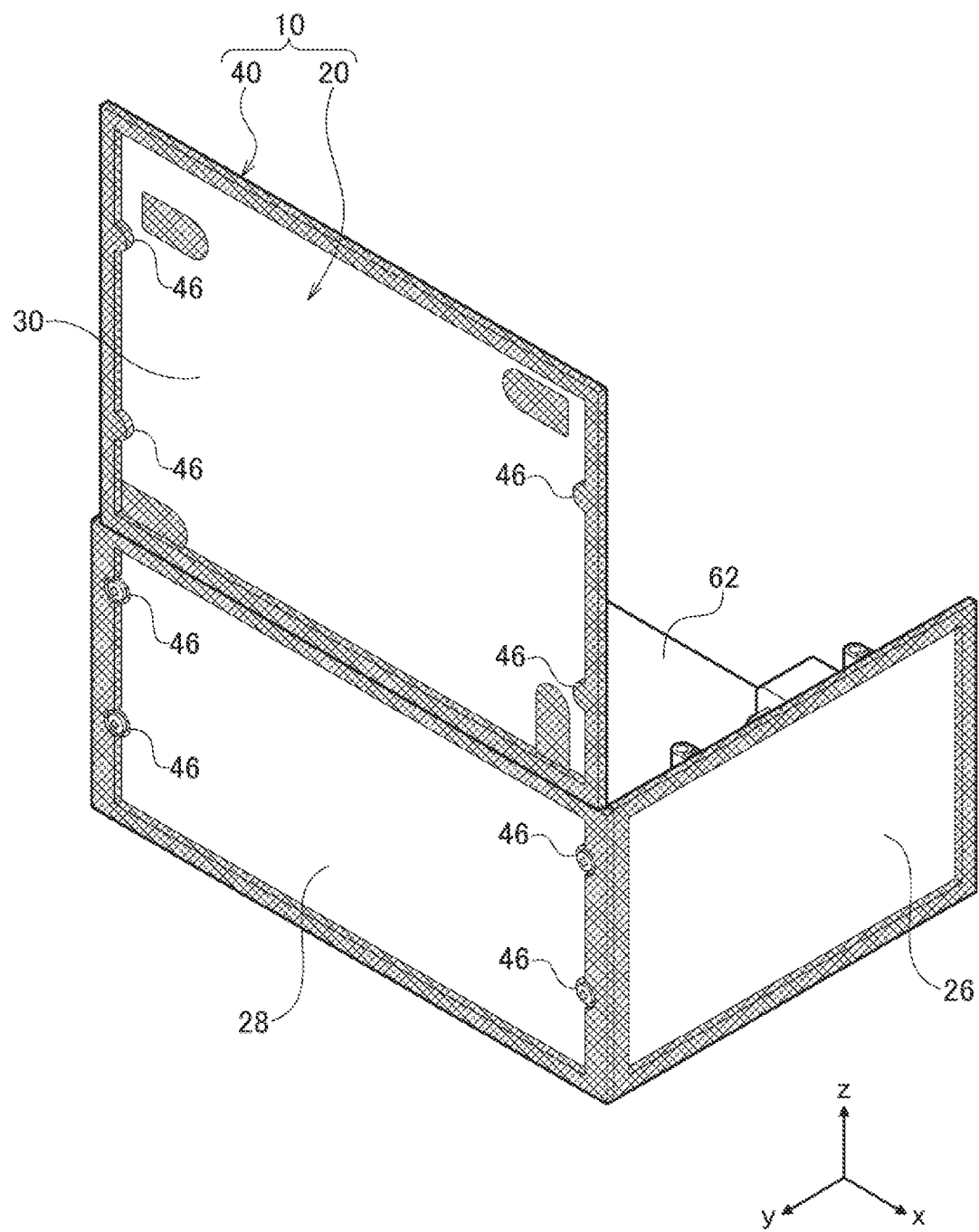
FIG. 10 is a perspective view illustrating the housing of FIG. 9 that has been bent further.

With reference to FIGS. 8 to 10, how to assemble electronic device 100 will be described below. First, as illustrated in FIG. 8, substrates 60, 62, 64, and 66, each of which is a circuit board on which electronic components (not shown) are mounted, are secured to developed housing 10. First substrate 60 is secured to substrate-securing portions 50 of bottom face portion 22 by screws. Second substrate 62 is secured to an upper surface side of first substrate 60 by a structure not shown in the drawings. Third substrate 64 is secured to substrate-securing portions 50 of top face portion 30 by screws. Fourth substrate 66 is secured to an upper surface side of third substrate 64 by a structure not shown in the drawings. Under this condition, necessary wiring work is performed for each of the substrates. Work such as mounting of substrates and wiring can be carried out easily because the work is performed while housing 10 is developed.

Next, as illustrated in FIG. 9, left-side face portion 24 and right-side face portion 26 of metal plate 20 are bent. Further, as illustrated in FIG. 10, front face portion 28 and top face portion 30 are bent. Under this condition, screws are fitted into housing screw hole portions 46 to secure front face portion 28 to left-side face portion 24 and right-side face portion 26. When top face portion 30 is bent from this condition and secured to left-side face portion 24 and right-side face portion 26, the state shown in FIG. 1 results, and assembling of electronic device 100 completes.

According to the first exemplary embodiment of the present disclosure, sufficient strength for protecting enclosed electronic components from impact and pressure is provided by reinforcing metal plate 20 of housing 10 with molded plastic parts 40. The reinforcing with molded plastic parts 40 makes it possible to provide sufficient strength even when metal plate 20 is made thinner than the case where housing 10 is formed from a single metal plate, allowing weight reduction of housing 10. Moreover, it is possible to easily bend metal plate 20 manually without using a processing machine. Therefore, assembly time is shortened. Bent part 44 of molded plastic part 40 includes notch 54 formed along bending area 21, which inhibits displacement from the bending position, so metal plate 20 can be bent at predetermined positions with high accuracy. Because housing 10 can be assembled by bending metal plate 20 easily, manufacturing costs are reduced. Furthermore, the electronic components are covered with metal plate 20. Therefore, radiation noise from outside is shielded, and also, noise radiation to outside can be reduced. When the rear end of housing 10 is closed by metal plate 20, shielding performance is further enhanced.

Next, a modified example of the first exemplary embodiment will be described. In the description and drawings of the modified example, same or similar elements and members are designated by the same reference signs as those used in the first exemplary embodiment. Repetitive description of like elements already described in the first exemplary embodiment is omitted as appropriate, and the configurations different from the exemplary embodiment will be intensively described.

For example, molded plastic part 40 may be formed on only one side of metal plate 20. When formed on both sides, molded plastic part 40 on each side may have a different thickness from each other. There may be a gap between perimeter portion 42 and the outer peripheral edge of metal plate 20. This increases the freedom in designing. In addition, molded plastic part 40 may include a rib for reinforcing metal plate 20. This improves the strength of housing 10.

Figure 11A:
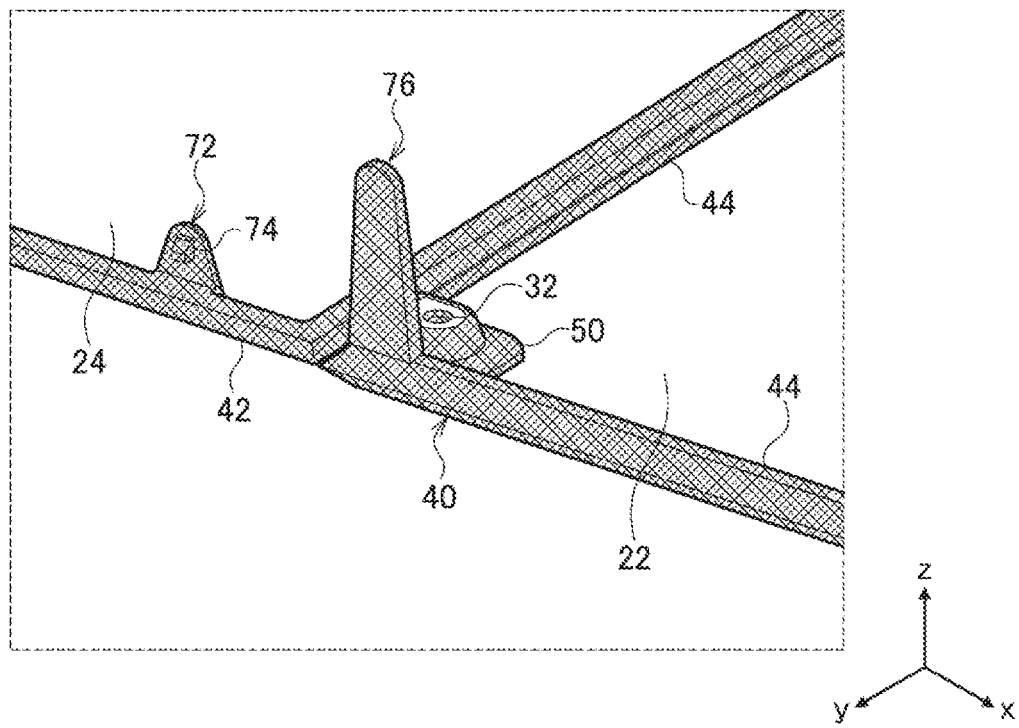
FIG. 11A is a partially enlarged view illustrating a developed housing of a modified example.
Figure 11B:
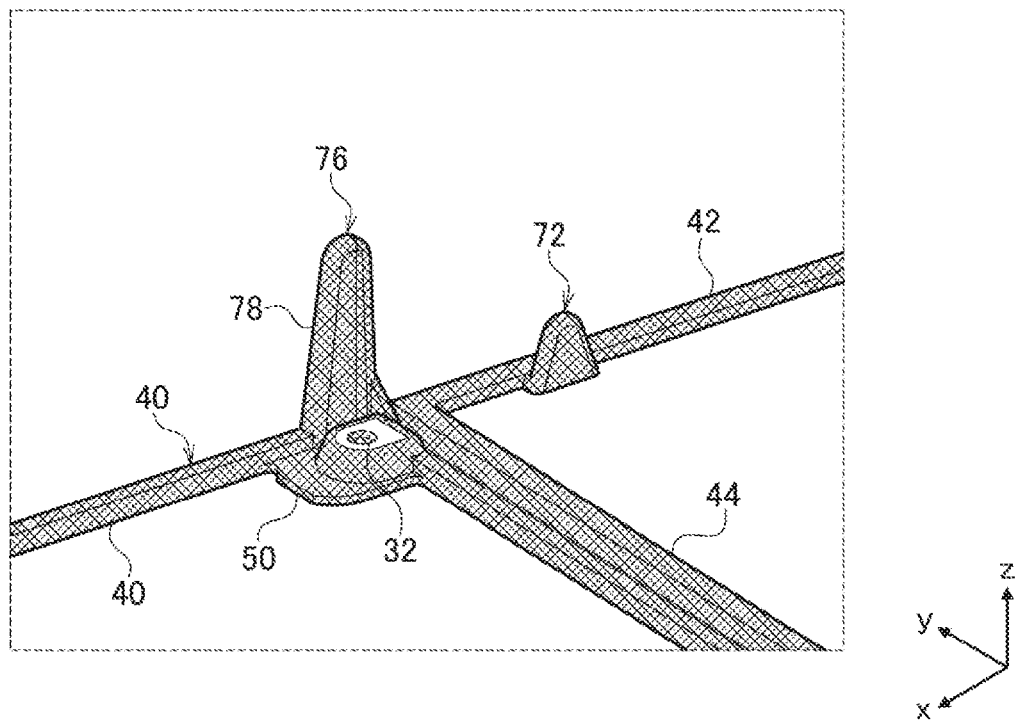
FIG. 11B is a view illustrating the portion shown in FIG. 11A, viewed from the opposite side.
Figure 12A:
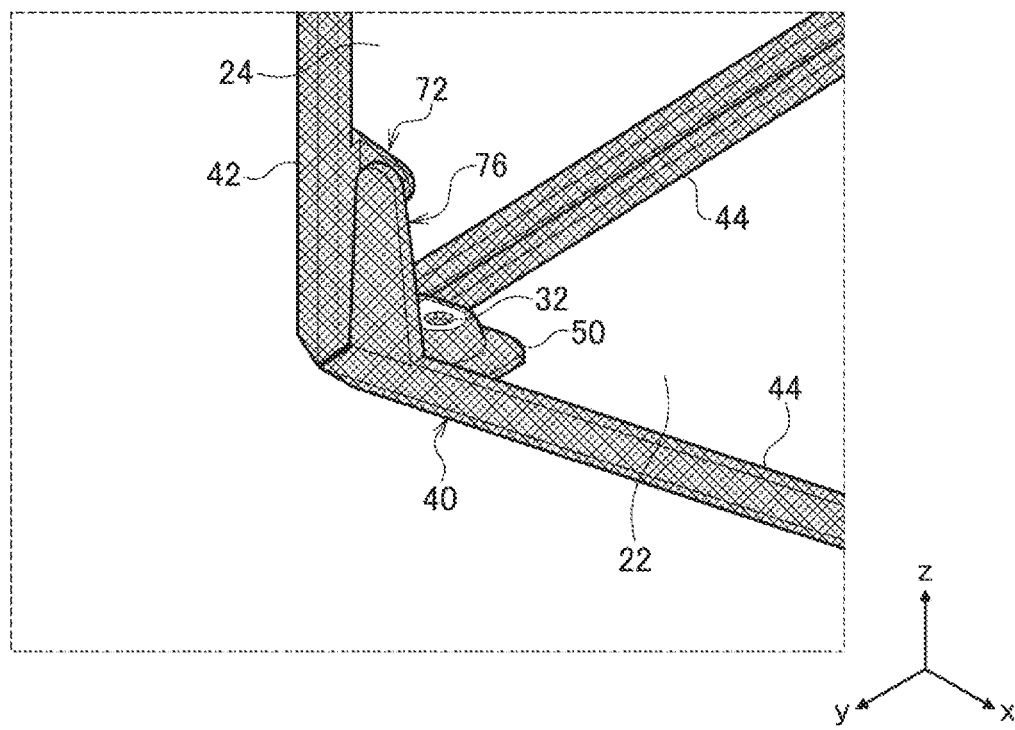
FIG. 12A is a partially enlarged view of the housing according to the modified example that has been assembled.
Figure 12B:
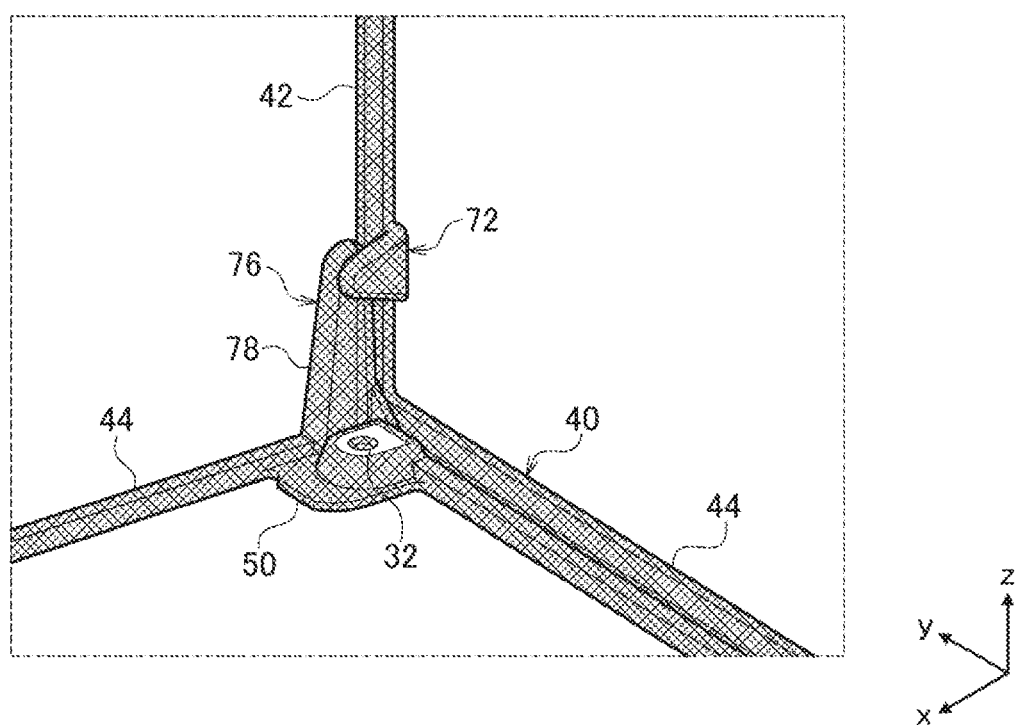
FIG. 12B is a view illustrating the portion shown in FIG. 12A, viewed from the opposite side.

As illustrated in FIGS. 11A to 12B, molded plastic part 40 may include a pair of fastening pieces 72 and 76 that are engaged with each other when housing 10 is assembled. FIGS. 11A and 11B are partially enlarged views illustrating a portion of developed housing 10 of the modified example, including fastening pieces 72 and 76. FIGS. 12A and 12B are partially enlarged views illustrating a portion of assembled housing 10 of the modified example, including fastening pieces 72 and 76.

Fastening piece 72 is formed so as to extend upward parallel to the z-axis from perimeter portion 42 of molded plastic part 40 when housing 10 is in a developed state, and fastening piece 72 includes protuberance 74 protruding forward parallel to the y-axis. Fastening piece 76 is formed so as to extend upward parallel to the z-axis from bent part 44 of molded plastic part 40, and fastening piece 76 includes fixing hook 78 extending parallel to the z-axis in the back. When metal plate 20 is bent, protuberance 74 of fastening piece 72 is fitted into fixing hook 78 of fastening piece 76 so that they are engaged with each other. When assembling housing 10, metal plate 20 is kept in a bent state, so assembly work can be carried out easily. It is also possible that fastening pieces may be provided at different parts of molded plastic part 40, and that two or more sets of fastening pieces may be provided.

Second Exemplary Embodiment

With reference to FIGS. 13A to 17, housing 12 according to a second exemplary embodiment will be described below. Electronic device 100 may include housing 12 in place of housing 10. Housing 12 is different from housing 10 according to the first exemplary embodiment in that it includes substrate-securing portion 80, and in other respects, housing 12 is similar to housing 10. Therefore, the description of housing 10 according to the first exemplary embodiment also applies to common elements. The modified example of the first exemplary embodiment may be likewise applied to housing 12 according to the second exemplary embodiment. In the following, repetitive description of already described elements is omitted, and substrate-securing portion 80 will be mainly described. Same or similar elements and members are designated by the same reference signs as those used for housing 10 according to the first exemplary embodiment.

Figure 13A:
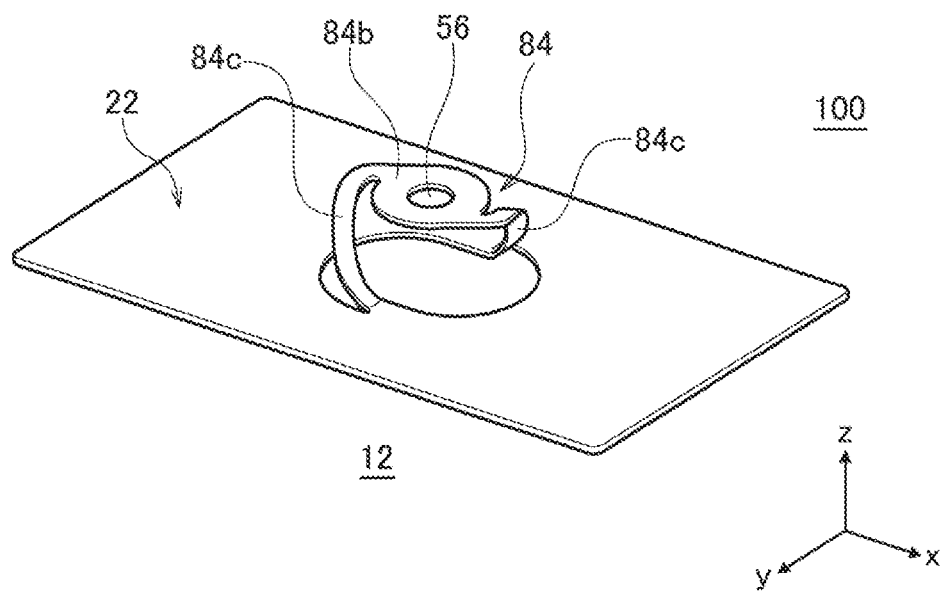
FIG. 13A is a perspective view illustrating a pierced-and-bent part provided in a housing according to a second exemplary embodiment of the present disclosure, excluding a covering part.
Figure 13B:
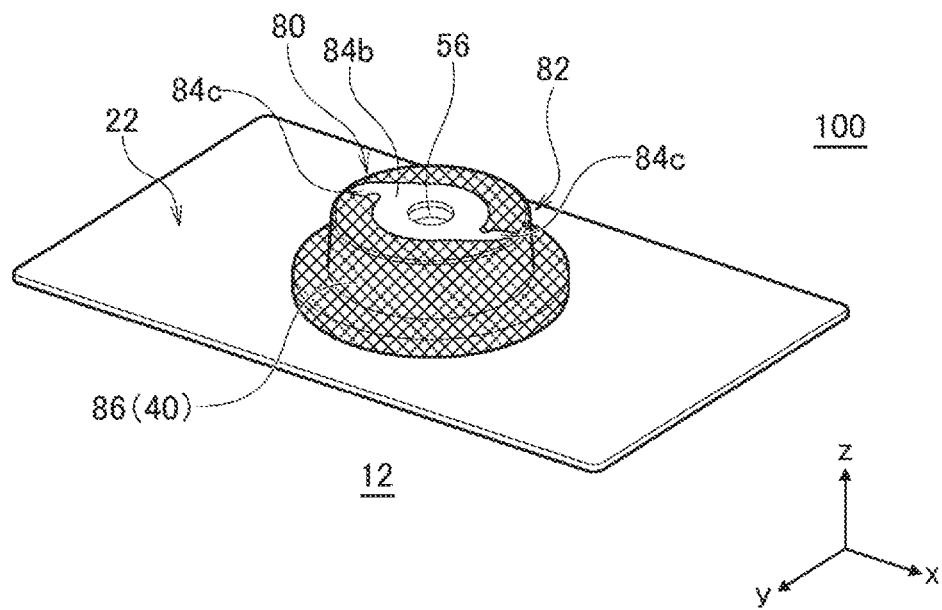
FIG. 13B is a perspective view illustrating a substrate-securing portion provided in the housing according to the second exemplary embodiment of the present disclosure.
Figure 14:
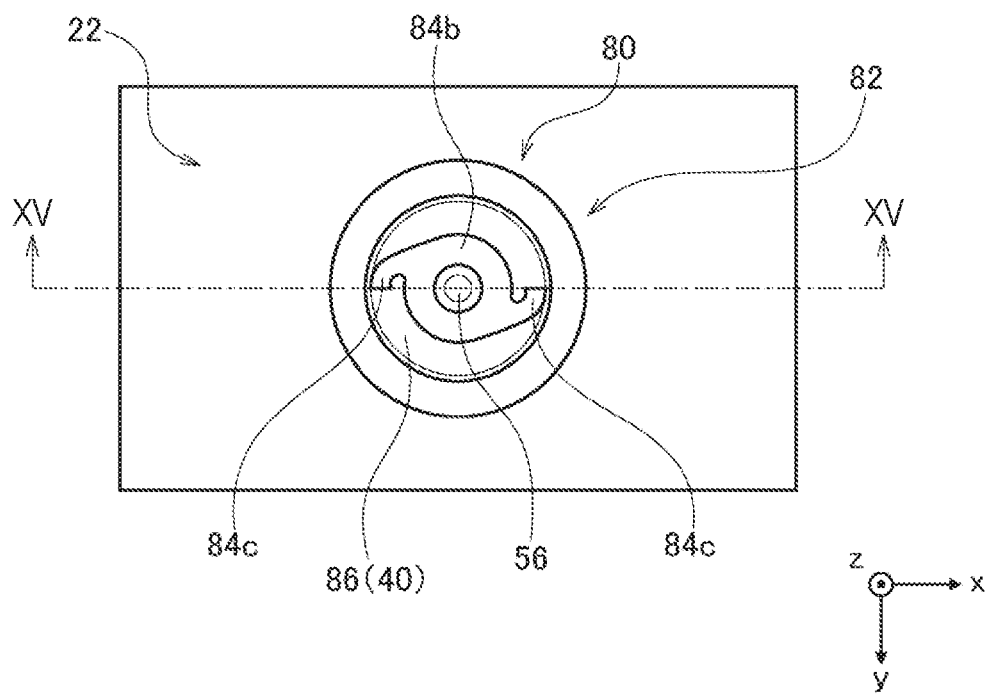
FIG. 14 is a plan view illustrating the substrate-securing portion shown in FIG. 13B.
Figure 15:
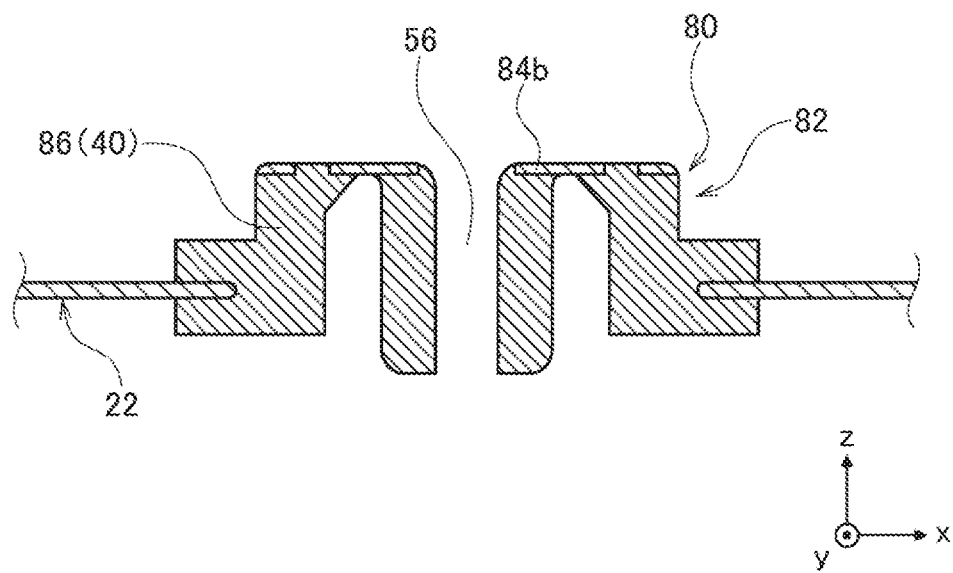
FIG. 15 is a cross-sectional view taken along line XV-XV in FIG. 14.

Substrate-securing portion 80 will be described below. Like substrate-securing portion 50, substrate-securing portion 80 functions as a securing portion for securing a substrate on which electronic components are mounted. FIG. 13A shows pierced-and-bent part 84, excluding covering part 86. FIG. 13B is a perspective view illustrating substrate-securing portion 80. FIG. 13B corresponds to FIG. 5. FIG. 14 is a plan view illustrating substrate-securing portion 80. FIG. 15 is a cross-sectional view illustrating substrate-securing portion 80, which shows the cross section taken along line XV-XV in FIG. 14.

As an example, substrate-securing portion 80 may be provided in bottom face portion 22. Substrate-securing portion 80 includes protruding portion 82 and substrate screw hole 56. Protruding portion 82 is formed in a columnar shape extending upward parallel to the z-axis from the surface of bottom face portion 22. A screw that penetrates through protruding portion 82 for securing the substrate on which electronic components are mounted is fitted into substrate screw hole 56. Protruding portion 82 includes pierced-and-bent part 84 and covering part 86. Covering part 86 is included in molded plastic part 40, and it covers pierced-and-bent part 84, which includes later-described connecting parts 84c.

Figure 16A:
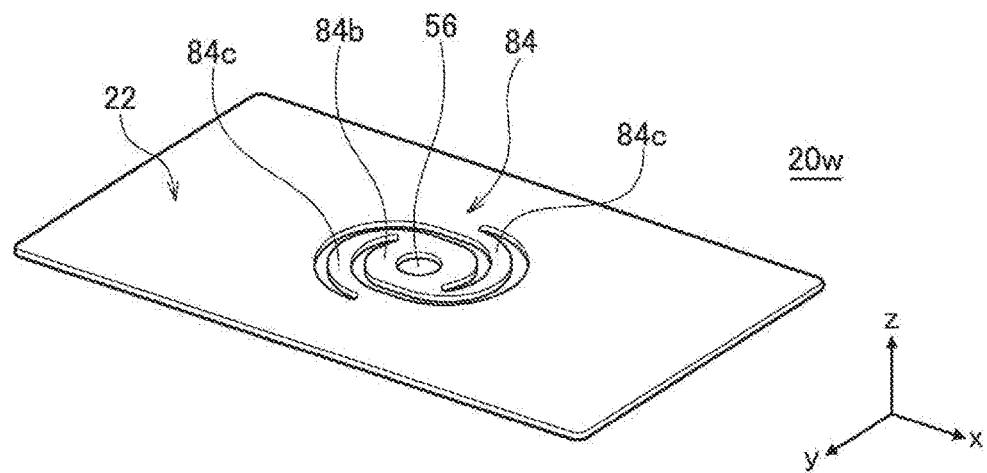
FIG. 16A is an illustrative view for illustrating a process of manufacturing the substrate-securing portion shown in FIG. 13B.
Figure 16B:
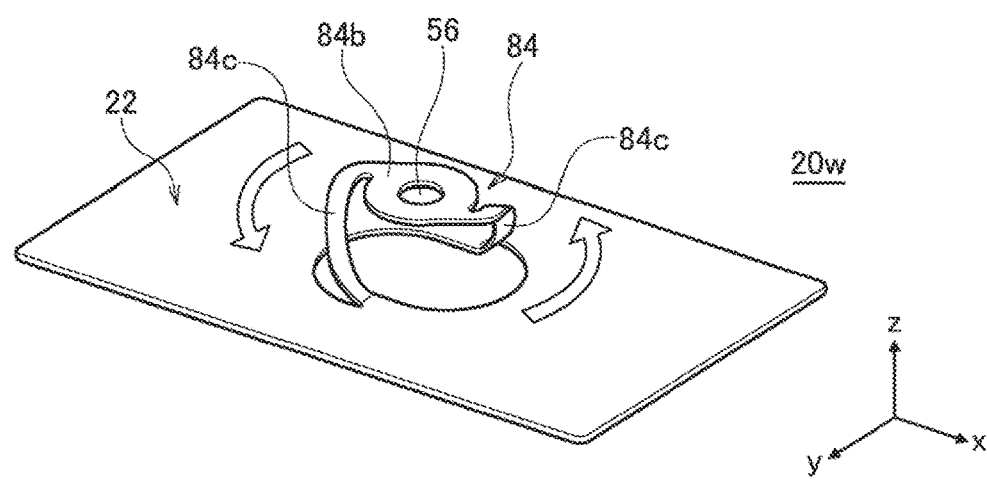
FIG. 16B is an illustrative view for illustrating a process of manufacturing the substrate-securing portion shown in FIG. 13B, subsequent to FIG. 16A.
Figure 16C:
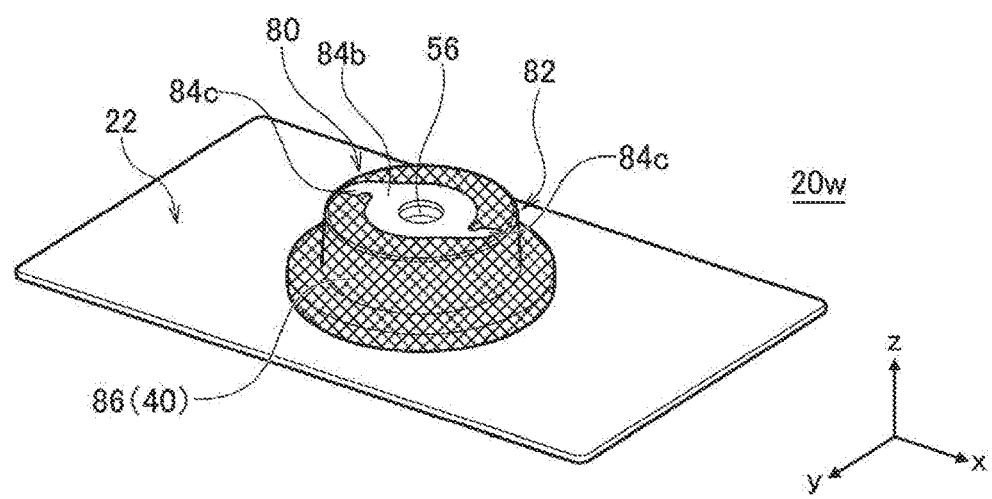
FIG. 16C is an illustrative view for illustrating a process of manufacturing the substrate-securing portion shown in FIG. 13B, subsequent to FIG. 16B.

Pierced-and-bent part 84 is a part that is formed by piercing or incising bottom face portion 22 to make a pierced or incised portion and bending parts of the pierced or incised portion from the surface of bottom face portion 22. Pierced-and-bent part 84 includes PCB contact part 84b and a plurality of connecting parts 84c. Each of connecting parts 84c extends in a helical shape from bottom face portion 22, which is the main part of metal plate 20, and is connected to PCB contact part 84b. Connecting parts 84c shown in FIGS. 15 to 16C are formed so as to be bent upward in a helical shape through protruding portion 82 of substrate-securing portion 80. Connecting parts 84c may be disposed, for example, at regular intervals around PCB contact part 84b. Although the number of connecting parts 84c is limited to a specific number, two connecting parts 84c are provided in this example. Two connecting parts 84c are formed in two-fold rotational symmetry with respect to the straight line that passes through the center of substrate screw hole 56 and is parallel to the z-axis.

PCB contact part 84b is formed so as to be bent from each of the connecting parts 84c along the upper surface of protruding portion 82 and extend in a direction parallel to the x-axis. PCB contact part 84b is a portion of pierced-and-bent piece 84 that is exposed on the upper surface of protruding portion 82. PCB contact part 84b is provided with a screw hole corresponding to substrate screw hole 56. The upper surface of PCB contact part 84b is exposed from protruding portion 82 so as to be in contact with a substrate that is to be secured to substrate-securing portion 80. PCB contact part 84b may have the same function as that of PCB contact part 32 of the first exemplary embodiment.

Figure 17:
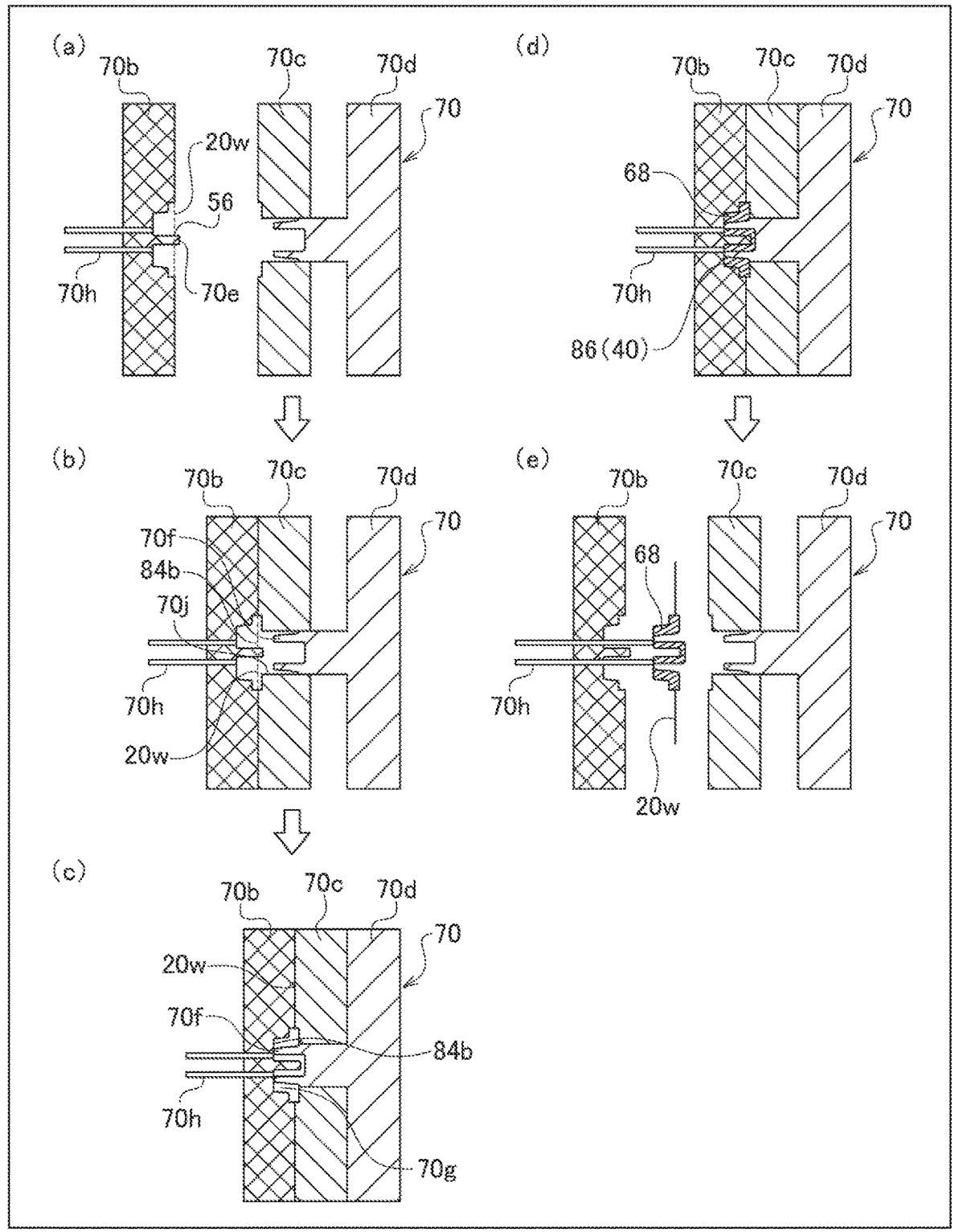
FIG. 17 is an illustrative view for illustrating one example of a process of manufacturing the substrate-securing portion shown in FIG. 13B.

Next, a process for manufacturing substrate-securing portion 80 will be described with reference to FIGS. 16A to 16C and 17. FIGS. 16A to 16C are illustrative views for illustrating a process of manufacturing substrate-securing portion 80. FIG. 17 is a view for illustrating the process steps for manufacturing substrate-securing portion 80. FIG. 17 schematically illustrates a portion of bottom face portion 22 in and around which substrate-securing portion 80 is formed. FIG. 17 illustrates the conditions in a metal mold when substrate-securing portion 80 is viewed in a direction along the y-axis. Hereinbelow, in the description referring to FIGS. 16A to 16C and 17, the region of bottom face portion 22 where substrate-securing portion 80 is formed is denoted as workpiece 20w.

(1) Workpiece 20w is prepared, in which PCB contact part 84b and a plurality of connecting parts 84c are formed in a flat state. Workpiece 20w in this state may be fabricated by a conventionally known method, such as presswork. FIG. 16A shows workpiece 20w formed in this state. Metal mold 70 for insert molding is prepared. Metal mold 70 includes metal molds 70b, 70c, and 70d, each of which is provided with a protrusion or a recess. In the example of FIG. 17, metal molds 70b and 70c are movable, and metal mold 70d is immovable. It is also possible that metal mold 70d may be movable and metal mold 70b may be immovable.

(2) As illustrated in drawing (a) of FIG. 17, workpiece 20w formed with PCB contact part 84b and the plurality of connecting parts 84c in a flat state is set into metal mold 70. Specifically, workpiece 20w shown in FIG. 16A is set into metal mold 70b, while metal molds 70b, 70c, and 70d are open. At this time, a predetermined hole in workpiece 20w may be fitted onto positioning pin 70e protruding from metal mold 70b. In this example, substrate screw hole 56 of workpiece 20w is fitted onto positioning pin 70e.

(3) As illustrated in drawing (b) of FIG. 17, metal mold 70b in which workpiece 20w is set is pressed against metal mold 70c. In this condition, workpiece 20w is sandwiched between metal mold 70b and metal mold 70c so as to restrict its movement.

(4) As illustrated in drawing (c) of FIG. 17, metal mold 70b and metal mold 70c that sandwich workpiece 20w are pressed against metal mold 70d. Metal mold 70d is provided with protrusion 70f protruding toward metal mold 70b, and metal mold 70c is provided with through-hole 70j through which protrusion 70f can pass. When metal mold 70b and metal mold 70c are moved toward metal mold 70d, protrusion 70f juts into metal mold 70b beyond through-hole 70j of metal mold 70c. In this process, PCB contact part 84b hits against protrusion 70f. When metal mold 70b and metal mold 70c are moved further, PCB contact part 84b is pressed by protrusion 70f, and is forced into recess 70g of metal mold 70b. When metal mold 70b and metal mold 70c are brought into close contact with metal mold 70d, PCB contact part 84b is sandwiched between protrusion 70f and the innermost surface of recess 70g. In the process in which PCB contact part 84b is pressed by protrusion 70f, PCB contact part 84b turns around positioning pin 70e so that the plurality of connecting parts 84c that have been in a spiral shape are deformed into a helical shape. FIG. 16B shows workpiece 20w including pierced-and-bent part 84 in which the plurality of connecting parts 84c have been deformed into a helical shape.

(5) As illustrated in drawing (d) of FIG. 17, molten resin 68 is injected into the cavity in metal mold 70, in a condition where metal mold 70b and metal mold 70c are in close contact with metal mold 70d, to shape molded plastic part 40 including covering part 86. After resin 68 has been injected, that condition is kept for a predetermined time to cure resin 68. Injected resin 68 cures while it covers the plurality of connecting parts 84c deformed into the helical shape. As resin 68 is cured, the plurality of connecting parts 84c are maintained in a deformed state in the helical shape, so that substrate-securing portion 80 is formed.

(6) As illustrated in drawing (e) of FIG. 17, when molded plastic part 40 is cured, metal mold 70 is opened to remove workpiece 20w, which has been formed with substrate-securing portion 80, from metal mold 70b. Workpiece 20w may be pressed out by knock-out member 70h. Knock-out member 70h may be a knock-out pin or a knock-out sleeve pin. After taking out of metal mold 70, workpiece 20w is in the state shown in FIG. 16C, so that the manufacture of substrate-securing portion 80 completes and the process of manufacturing substrate-securing portion 80 ends. This process is merely an example, and it is also possible to add other steps, eliminate any of the steps, and change the order of the steps.

Although the description of the second exemplary embodiment has been made about an example in which a workpiece in a flat state is set into metal mold 70, the present disclosure is not limited thereto. It is also possible to mold substrate-securing portion 80 by setting a non-planar workpiece that has been preliminarily bending-processed into a mold, closing the mold to bent a portion of the workpiece, and injecting a resin into the mold.

Third Exemplary Embodiment

Next, housing 14 according to a third exemplary embodiment will be described with reference to FIGS. 18A to 21C. Electronic device 100 may include housing 14 in place of housing 10. Housing 14 is different from housing 10 according to the first exemplary embodiment in that it includes pre-tension contact part 90, and in other respects, housing 14 is similar to housing 10. Therefore, the description of housing 10 according to the first exemplary embodiment also applies to common elements. The modified example of the first exemplary embodiment may be likewise applied to housing 14 according to the third exemplary embodiment. In the following, repetitive description of already described elements is omitted, and pre-tension contact part 90 will be mainly described. Same or similar elements and members are designated by the same reference signs as those used for housing 10 according to the first exemplary embodiment.

Figure 18A:
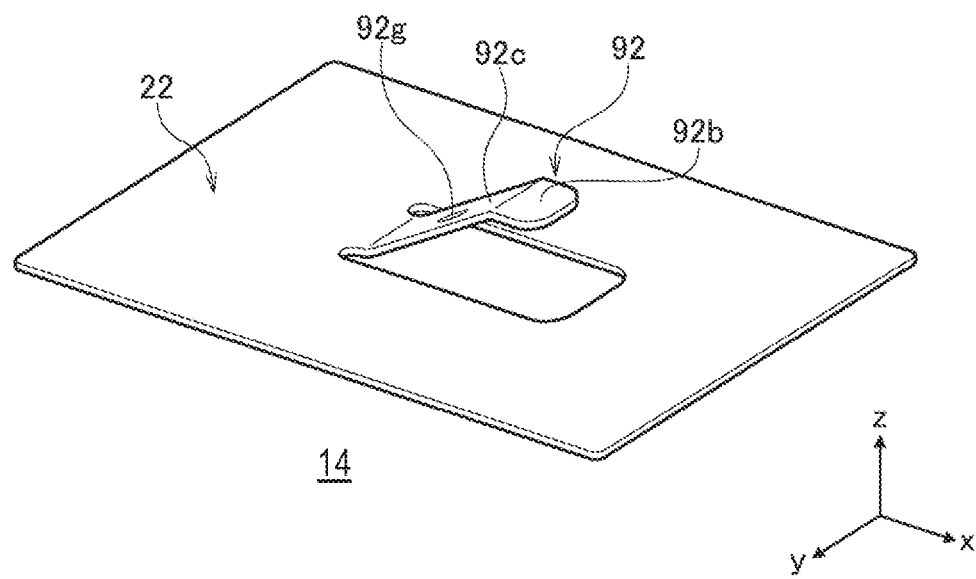
FIG. 18A is a perspective view illustrating a pierced-and-bent part provided in a housing according to a third exemplary embodiment of the present disclosure, excluding a resin portion.
Figure 18B:
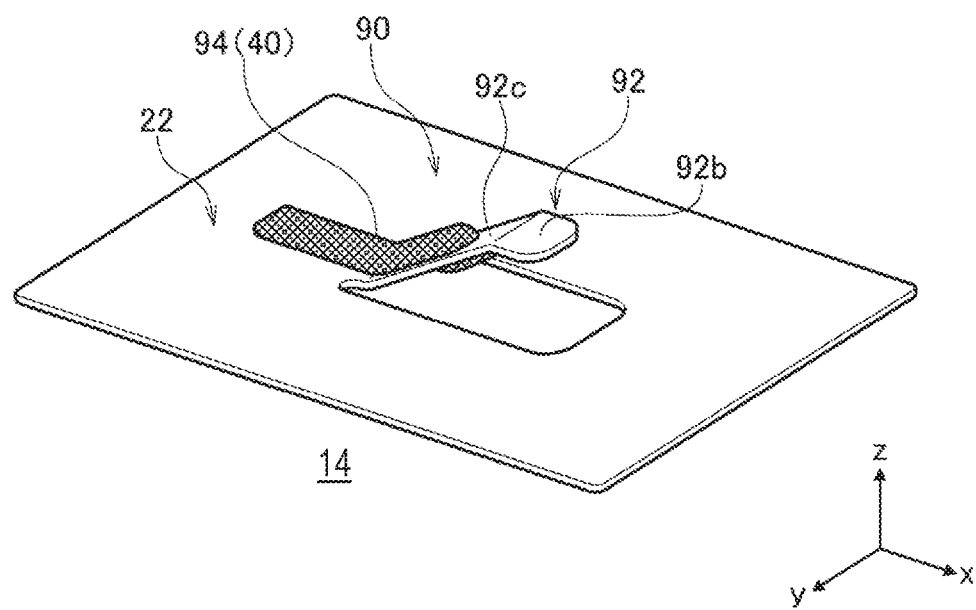
FIG. 18B is a perspective view illustrating a pre-tension contact part provided in the housing according to the third exemplary embodiment of the present disclosure.
Figure 19:
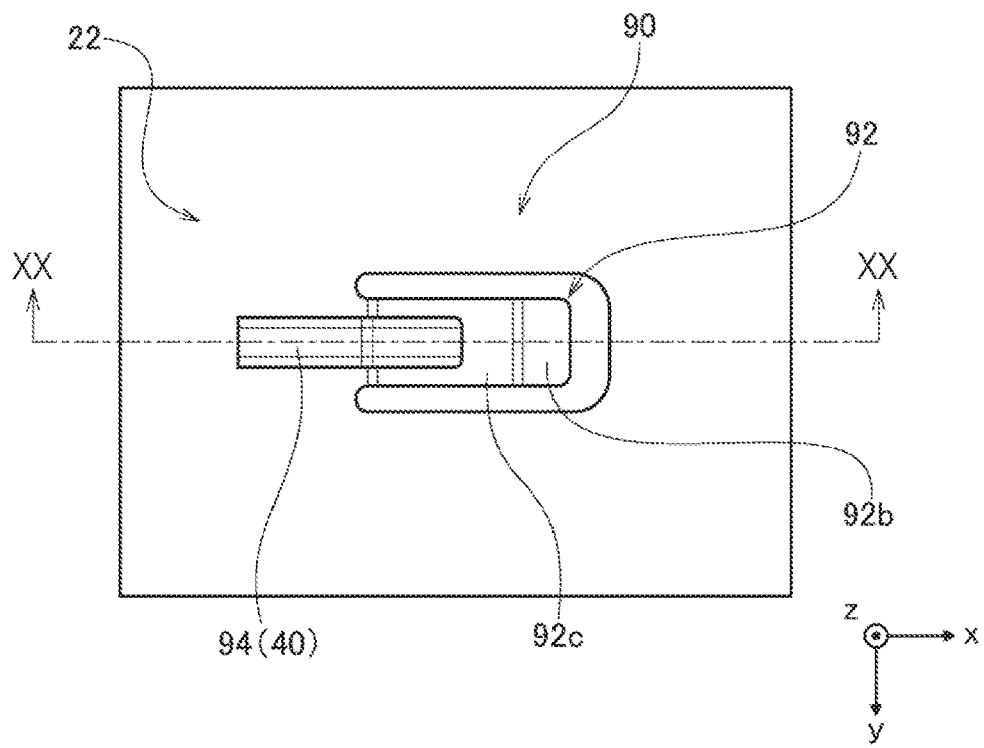
FIG. 19 is a plan view illustrating the pre-tension contact part shown in FIG. 18B.
Figure 20:
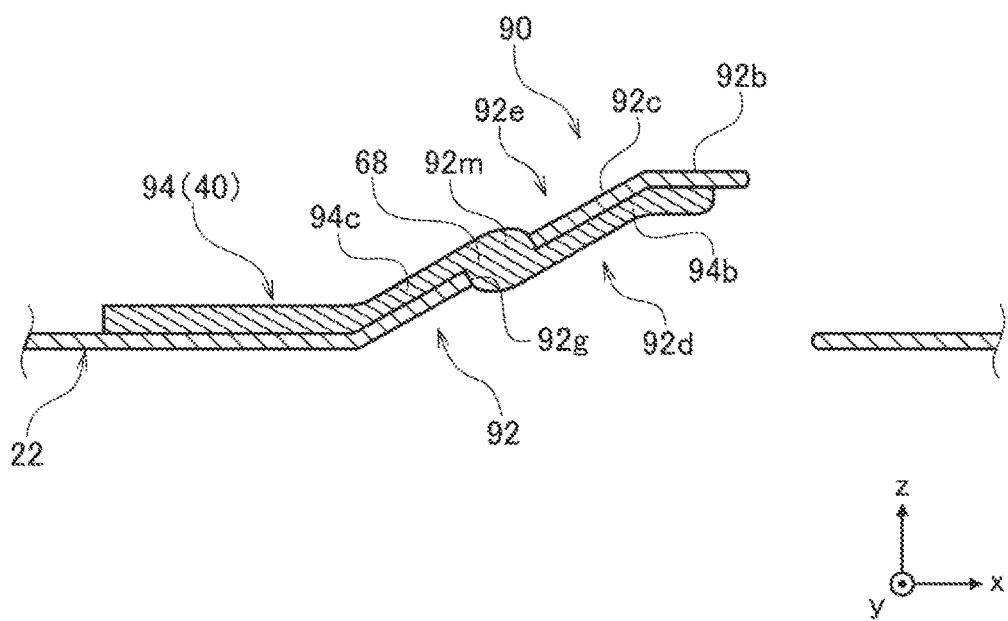
FIG. 20 is a cross-sectional view taken along line XX-XX in FIG. 19.

Pre-tension contact part 90 functions as a contact member that extends from metal plate 20 and makes electrical contact with a substrate on which electronic components are mounted. A portion of pre-tension contact part 90 to be contact with the substrate is to be biased toward the substrate. FIG. 18A shows lancing part 92 excluding resin portion 94. FIG. 18B is a perspective view illustrating pre-tension contact part 90. FIG. 19 is a plan view illustrating pre-tension contact part 90. FIG. 20 is a cross-sectional view illustrating pre-tension contact part 90, which shows the cross section taken along line XX-XX in FIG. 19.

As an example, pre-tension contact part 90 may be provided in bottom face portion 22. Pre-tension contact part 90 includes lancing part 92 and resin portion 94. Lancing part 92 is a part that is formed by piercing or incising bottom face portion 22 to make a pierced or incised portion and erecting the pierced or incised portion from the surface of bottom face portion 22. In the example of FIG. 19, lancing part 92 is formed in a strip shape extending from bottom face portion 22 in plan view. Lancing part 92 includes PCB contact part 92b for making contact with the substrate on which electronic components are mounted, and biasing portion 92c for imparting a biasing force toward the substrate to PCB contact part 92b. Biasing portion 92c is a portion of lancing part 92 and extends obliquely upward from bottom face portion 22, which is a main part of metal plate 20.

Biasing portion 92c has a shape such that it elastically deforms when PCB contact part 92b makes contact with the substrate so as to impart a biasing force toward the substrate to PCB contact part 92b. The shape of biasing portion 92c may be set so that desired biasing characteristics can be obtained. In the example of FIG. 19, biasing portion 92c is formed in substantially a rectangular shape in which its longer axis is set along its extending axis and the shorter-axis dimension is set to be within the range from 30% to 70% of the longer-axis dimension. The thickness dimension of biasing portion 92c may be set so that desired biasing characteristics can be obtained. In the example of FIG. 20, biasing portion 92c is formed so that the thickness dimension thereof falls within the range from 0.2 mm to 0.4 mm.

PCB contact part 92b is a portion of lancing part 92 and is bent from biasing portion 92c to extend in a direction parallel to the x-axis. PCB contact part 92b is formed so that the upper surface is exposed from resin portion 94 to make contact with the substrate. PCB contact part 92b may have the same electrical function as that of PCB contact part 32 of the first exemplary embodiment.

Resin portion 94 is included in molded plastic part 40 and covers at least a portion of lancing part 92. In particular, resin portion 94 includes first portion 94b arranged on surface 92d, which is a first surface of biasing portion 92c, and a second portion 94c arranged on surface 92e, which is a second surface of biasing portion 92c. Surface 92d may be a surface of biasing portion 92c that faces bottom face portion 22, and surface 92e may be a surface of biasing portion 92c that is opposite to bottom face portion 22. First portion 94b extends from intermediate portion 92m of biasing portion 92c toward PCB contact part 92b along surface 92d. Intermediate portion 92m may be a portion of biasing portion 92c and is intermediate along the extending axis, and it may be provided, for example, in an intermediate region along the extending axis of biasing portion 92c. Intermediate portion 92m may be a middle region along the extending axis of biasing portion 92c. In the example of FIG.

20, first portion 94b extends to the lower surface of PCB contact part 92b, beyond biasing portion 92c.

Second portion 94c extends from intermediate portion 92m of biasing portion 92c toward bottom face portion 22 along surface 92e. In the example of FIG. 20, second portion 94c extends to the upper surface of bottom face portion 22 beyond biasing portion 92c. Intermediate portion 92m of biasing portion 92c is provided with through-hole 92g that penetrates through intermediate portion 92m from surface 92d to surface 92e. First portion 94b and second portion 94c are unitarily connected via through-hole 92g.

The shape of through-hole 92g is not limited to a particular shape. In the example of FIG. 20, through-hole 92g is formed in an elliptical or oval shape, in which its longer axis is along its extending axis and the shorter-axis dimension is set to be within the range from 30% to 70% of the longer-axis dimension. Through-hole 92g may be in a rectangular shape. If through-hole 92g is too small, the amount of resin 68 that enters through-hole 92g is insufficient, so that part of resin portion 94 may be lost. From this viewpoint, it is preferable that the shorter-axis dimension of through-hole 92g be two times or greater, more preferably three times or grater, with respect to the thickness dimension of biasing portion 92c. The shapes of lancing part 92 and resin portion 94 may be determined by simulation so that desired biasing characteristics can be obtained.

Figure 21A:
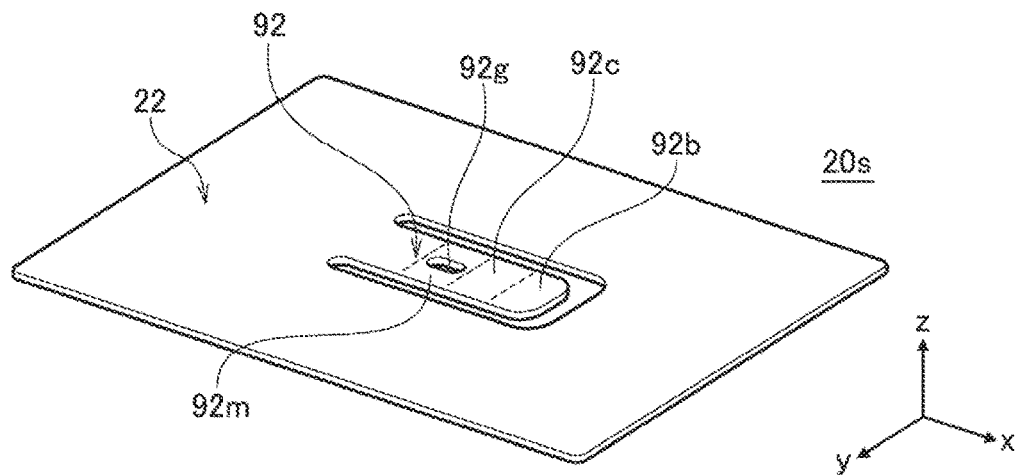
FIG. 21A is an illustrative view for illustrating a process of manufacturing the pre-tension contact part shown in FIG. 18B.
Figure 21B:
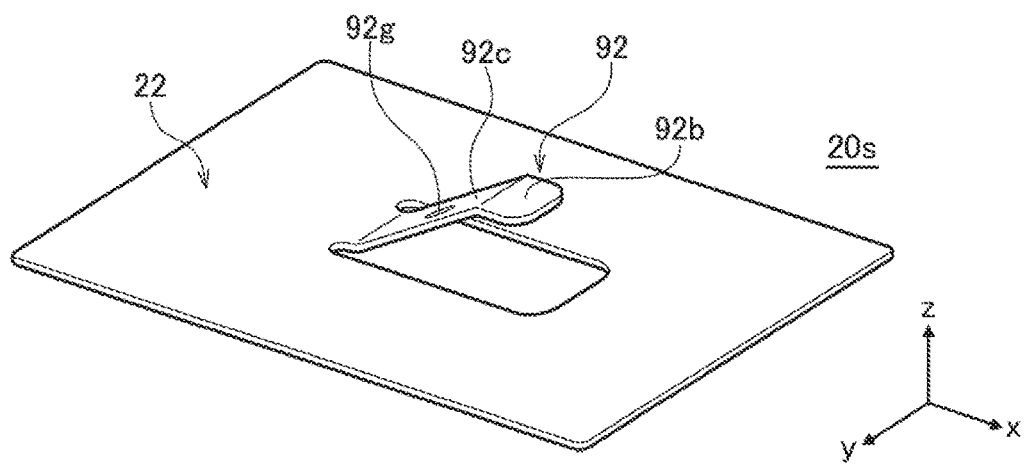
FIG. 21B is an illustrative view for illustrating a process of manufacturing the pre-tension contact part shown in FIG. 18B, subsequent to FIG. 21A.
Figure 21C:
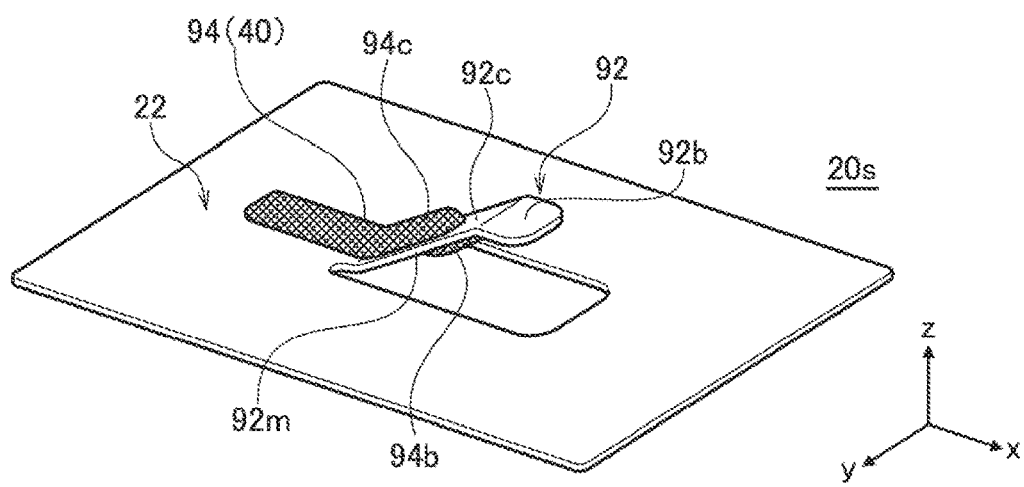
FIG. 21C is an illustrative view for illustrating a process of manufacturing the pre-tension contact part shown in FIG. 18B, subsequent to FIG. 21B.

Next, a process for manufacturing pre-tension contact part 90 will be described with reference to FIGS. 21A to 21C. FIGS. 21A to 21C are illustrative views for illustrating a process of manufacturing pre-tension contact part 90. Hereinbelow, in the description referring to FIGS. 21A to 21C, the region of metal plate 20 where pre-tension contact part 90 is formed is denoted as workpiece 20s. The process for manufacturing substrate-securing portion 80, which has been described with reference to FIG. 17, may be applied to the manufacture of pre-tension contact part 90. In this case, workpiece 20w should be replaced with workpiece 20s. Hereinafter, important points or differences will be described referring also to FIG. 17.

(1) Workpiece 20s is prepared, in which PCB contact part 92b and biasing portion 92c are formed in a flat state. Workpiece 20s in this state may be fabricated by a conventionally known method, such as presswork. FIG. 21A shows workpiece 20s formed in this state.

(2) Workpiece 20s is set into metal mold 70b.

(3) Metal mold 70b in which workpiece 20s has been set is pressed against metal mold 70c.

(4) Metal mold 70b and metal mold 70c that sandwich workpiece 20s are pressed against metal mold 70d. Metal mold 70d is provided with a protrusion protruding toward metal mold 70b, and in this process, lancing part 92 hits against the protrusion. When metal mold 70b and metal mold 70c are moved, lancing part 92 is pressed and deformed by the protrusion. In this process, a portion including PCB contact part 92b is forced into recess 70g of metal mold 70b. When metal mold 70b and metal mold 70c are brought into close contact with metal mold 70d, PCB contact part 92b is sandwiched between the protrusion and the innermost surface of recess 70g. In this process, metal mold 70b and metal mold 70c may cause lancing part 92 to undergo plastic deformation into a predetermined shape. FIG. 21B shows workpiece 20s including lancing part 92 that has been deformed into the predetermined shape.

(5) Molten resin 68 is injected into the cavity in metal mold 70 to shape molded plastic part 40 including resin portion 94.

(6) When workpiece 20s in which pre-tension contact part 90 has been formed is removed from metal mold 70, workpiece 20s is in the state shown in FIG. 21C, so that the manufacture of pre-tension contact part 90 completes. The above-described process is merely an example, and it is also possible to add other steps, eliminate any of the steps, and change the order of the steps.

Figure 22A:
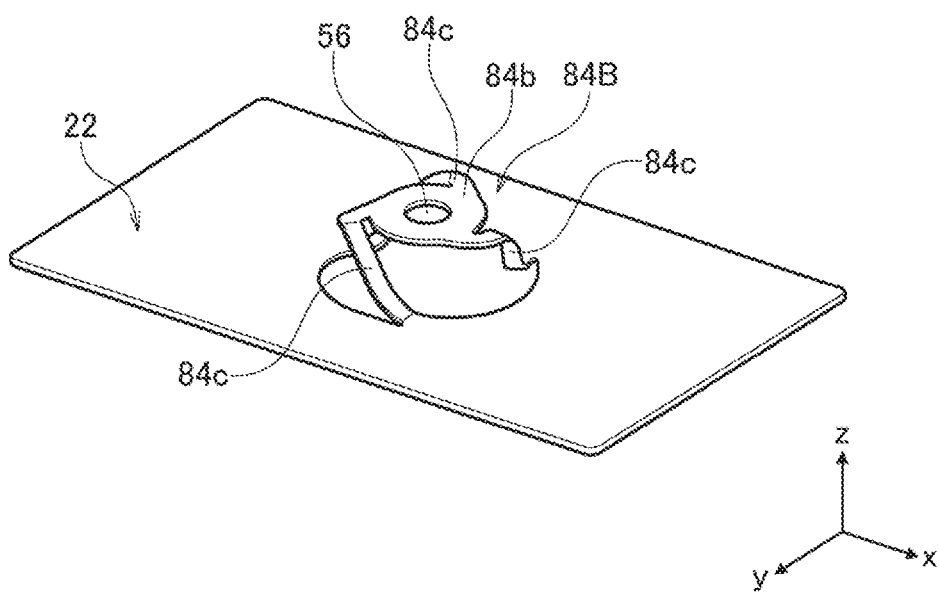
FIG. 22A is a perspective view illustrating a pierced-and-bent part provided in a housing according to a modified example of the second exemplary embodiment of the present disclosure, excluding a covering part.
Figure 22B:
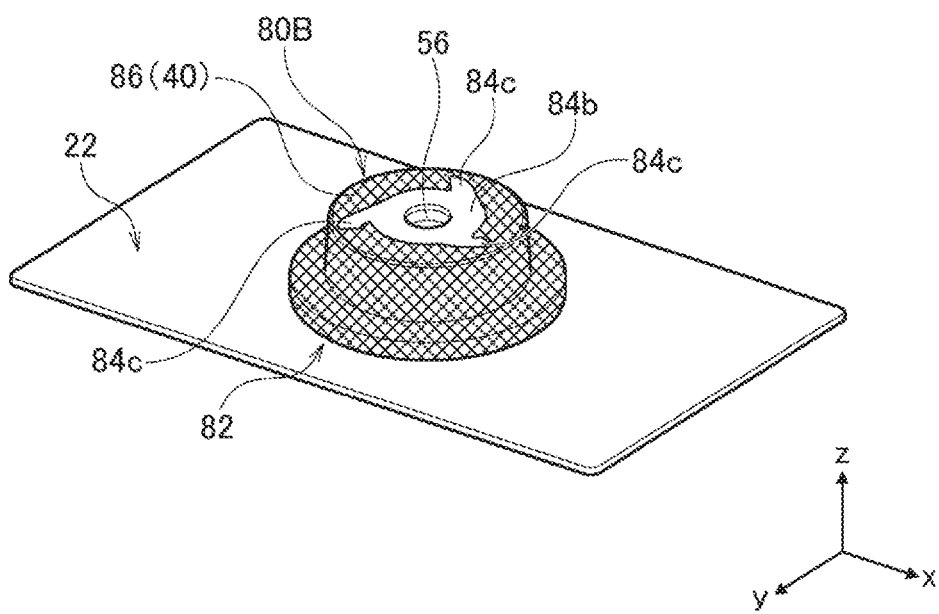
FIG. 22B is a perspective view illustrating a substrate-securing portion provided in the housing according to the modified example of the second exemplary embodiment of the present disclosure.
Figure 23:
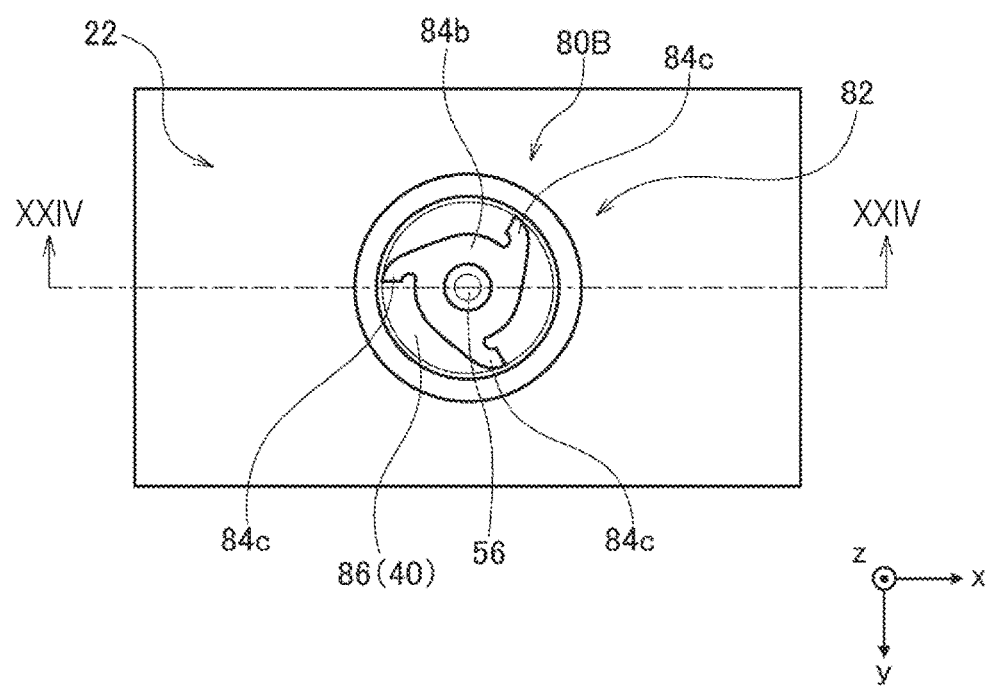
FIG. 23 is a plan view illustrating the substrate-securing portion shown in FIG. 22B.
Figure 24:
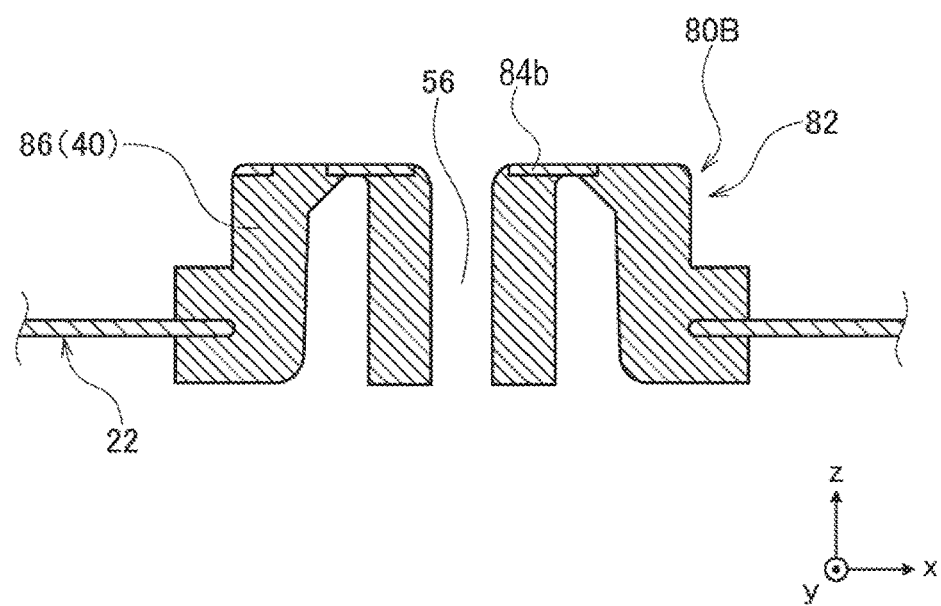
FIG. 24 is a cross-sectional view taken along line XXIV-XXIV in FIG. 23.
Figure 25A:
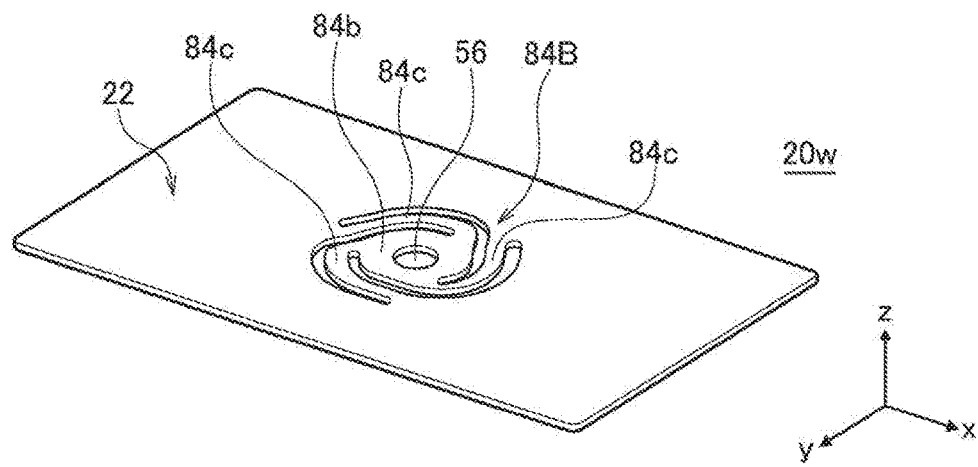
FIG. 25A is an illustrative view for illustrating a process of manufacturing the substrate-securing portion shown in FIG. 22B.
Figure 25B:
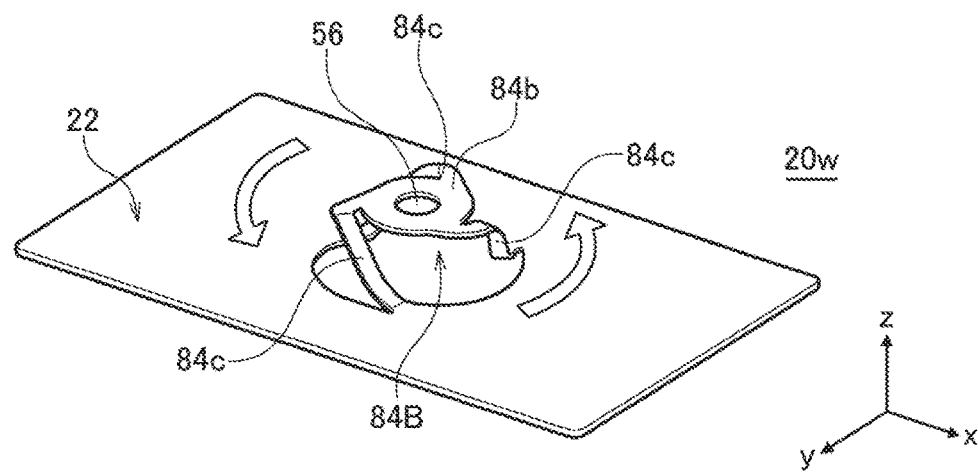
FIG. 25B is an illustrative view for illustrating a process of manufacturing the substrate-securing portion shown in FIG. 22B, subsequent to FIG. 25A.
Figure 25C:
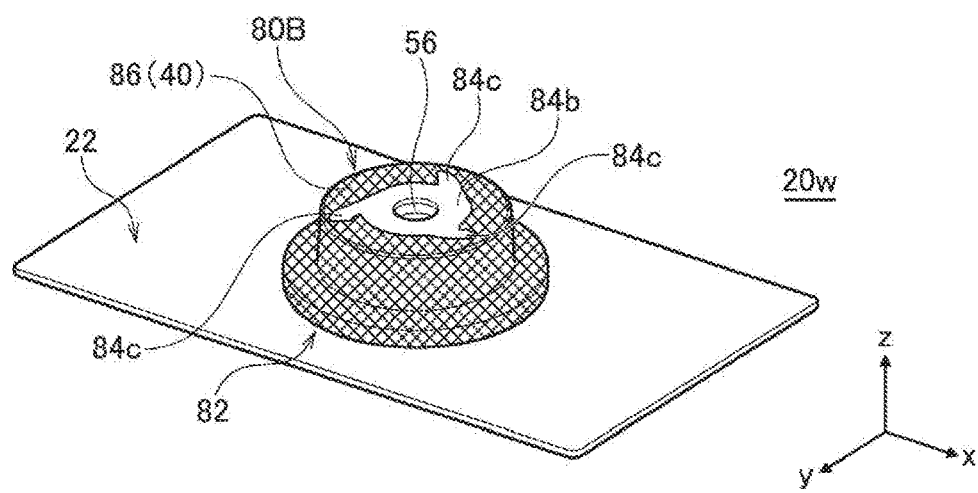
FIG. 25C is an illustrative view for illustrating a process of manufacturing the substrate-securing portion shown in FIG. 22B, subsequent to FIG. 25B.

Next, a modified example of substrate-securing portion 80 (hereinafter referred to as substrate-securing portion 80B) will be described with reference to FIGS. 22A to 25C. Substrate-securing portion 80B is different from substrate-securing portion 80 in the number of connecting parts 84c, but in other respects, substrate-securing portion 80B is similar to substrate-securing portion 80. Therefore, in the following description, elements that are the same as or similar to those of substrate-securing portion 80 are designated by the same reference signs, and different elements will be described. Therefore, the description of substrate-securing portion 80 applies to common elements. FIG. 22A shows pierced-and-bent part 84B excluding covering part 86. FIG. 22B is a perspective view illustrating substrate-securing portion 80B. FIG. 23 is a plan view illustrating substrate-securing portion 80B. FIG. 24 is a cross-sectional view illustrating substrate-securing portion 80B, which shows the cross section taken along line XXIV-XXIV in FIG. 23. FIGS. 25A to 25C are illustrative views for illustrating a process of manufacturing substrate-securing portion 80B.

Although the description of the substrate-securing portion 80 has been made about an example in which pierced-and-bent part 84 includes two connecting parts 84c, this description is merely illustrative. The pierced-and-bent part may include three or more connecting parts 84c. The pierced-and-bent part of substrate-securing portion 80B (which is hereinafter referred to as "pierced-and-bent part 84B") includes three connecting parts 84c. Three connecting parts 84c are disposed, for example, at regular intervals around PCB contact part 84b. Three connecting parts 84c are formed in three-fold rotational symmetry with respect to the straight line that passes through the center of substrate screw hole 56 and is parallel to the z-axis.

Substrate-securing portion 80B may be manufactured by the process for manufacturing substrate-securing portion 80, which has been described with reference to FIG. 17. FIG. 25A shows workpiece 20w including pierced-and-bent part 84B in which PCB contact part 84b and three connecting parts 84c are formed in a flat state. FIG. 25B shows workpiece 20w including pierced-and-bent part 84B in which three connecting parts 84c have been deformed into a helical shape. FIG. 25C shows workpiece 20w including substrate-securing portion 80B in a state in which the manufacture has been completed.

Substrate-securing portion 80B of the modified example has the same features as those of substrate-securing portion 80. In addition, because substrate-securing portion 80B includes three connecting parts 84c, the area in which PCB contact part 84b and bottom face portion 22 connect with each other is increased so that ground connectivity can be enhanced. Moreover, because PCB contact part 84b is supported by three connecting parts 84c, PCB contact part 84b is prevented from deviating from the center when PCB contact part 84b is pressed inside metal mold 70.

The outline of an embodiment of the present disclosure is as follows. One aspect of the present disclosure provides housing 10 formed by bending metal plate 20 including molded plastic part 40. Molded plastic part 40 includes perimeter portion 42 formed along an outer peripheral edge of metal plate 20, and bent part 44 formed in bending area 21 in which metal plate 20 is bent, and bent part 44 is provided with notch 54 located along bending area 21. This aspect makes it possible to provide sufficient strength by reinforcing metal plate 20 with molded plastic part 40 and also to achieve weight reduction by making metal plate 20 thinner.

In bent part 44, metal plate 20 may be exposed along bending area 21. In this case, molded plastic part 40 is not formed at a portion in bending area 21. Therefore, metal plate 20 can be bent more easily, and assembling can be performed easily.

Notch 54 may have a V-shape of which width increases away from metal plate 20. In this case, metal plate 20 may be bent more easily, so assembling is made more easily.

Molded plastic part 40 may include substrate-securing portion 50 to secure a substrate on which electronic components are mounted, and metal plate 20 may include PCB contact part 32 to be contact with the substrate secured to the substrate-securing portion. Because PCB contact part 32 of metal plate 20 makes contact with the substrate mounted to substrate-securing portion 50, the ground potential is stabilized in the substrate to be secured, and noise is reduced.

Molded plastic part 40 may include a pair of fastening pieces 72 and 76 engaged with each other in a state where metal plate 20 is bent. In this case, fastening pieces 72 and 76 keep metal plate 20 in the bent state when bending metal plate 20 to assemble housing 10. As a result, assembly work can be carried out more easily.

Metal plate 20 may include PCB contact part 84b to be contact with a substrate on which electronic components are mounted, and connecting part 84c extending from metal plate 20 and being connected to PCB contact part 84b. Molded plastic part 40 may include covering part 86 covering connecting part 84c. Connecting part 84c may be bent into a helical shape. In this case, covering part 86 covers connecting part 84c. Therefore, covering part 86 can reinforce connecting part 84c. Sufficient strength is provided even when the width of connecting part 84c is reduced, so that the weight of housing 12 can be reduced.

Metal plate 20 includes PCB contact part 92b to be contact with a substrate on which electronic components are mounted, and biasing portion 92c that extends from metal plate 20 to PCB contact part 92b and exerts a biasing force toward the substrate to PCB contact part 92b. Molded plastic part 40 may include first portion 94b and second portion 94c. First portion 94b is disposed on surface 92d of biasing portion 92c and extends from intermediate portion 92m of biasing portion 92c toward PCB contact part 92b. Second portion 94c is disposed on surface 92e of biasing portion 92c, and extends from intermediate portion 92m toward metal plate 20. This configuration enables first portion 94b and second portion 94c to reinforce biasing portion 92c. A sufficient biasing force is ensured even when the width of biasing portion 92c is reduced, so that the weight of housing 14 can be reduced.

Another aspect of the present disclosure is electronic device 100. Electronic device 100 includes housing 10. This aspect makes it possible to provide sufficient strength while achieving weight reduction because electronic device 100 includes the foregoing housing 10. Moreover, radiation noise from outside can be shielded, and noise radiation to outside can be reduced. Furthermore, electronic device 100 can be assembled easily, and manufacturing costs can be reduced.

Still another aspect of the present disclosure is a manufacturing method. This method is a method for manufacturing housing 12 including substrate-securing portion 80. The method includes: disposing metal plate material (20w) into metal mold 70, the metal plate material (20w) including PCB contact part 84b and connecting part 84c; bending connecting part 84c into a helical shape by closing metal mold 70; and, in metal mold 70, supplying a resin material to a region around connecting part 84c that has been bent into the helical shape, to mold covering part 86. According to this method, the bending of connecting part 84c and the molding of covering part 86 around connecting part 84c are carried out continuously using the same metal mold 70. Therefore, the adverse effects resulting from precision error of the metal mold can be reduced in comparison with the method in which these steps are carried out using different metal molds. The amount of the resin adhering onto the upper surface of PCB contact part 84b is reduced, so electrical contact of PCB contact part 84b with the substrate can be facilitated.

Yet another aspect of the present disclosure is also a manufacturing method. This method is a method for manufacturing housing 14 including pre-tension contact part 90. The method includes: disposing metal plate material (20s) into metal mold 70, the metal plate material (20s) including PCB contact part 92b and biasing portion 92c; bending biasing portion 92c by closing metal mold 70; and, in metal mold 70, supplying a resin material to a region around biasing portion 92c that has been bent, to mold first portion 94b and second portion 94c. According to this method, the bending of biasing portion 92c and the molding of resin portion 94 around biasing portion 92c are carried out continuously using the same metal mold 70. Therefore, the adverse effects resulting from precision error of the metal mold can be reduced in comparison with the method in which these steps are carried out using different metal molds. The amount of the resin adhering onto the upper surface of PCB contact part 92b is reduced, so electrical contact of PCB contact part 92b with the substrate can be facilitated.

Hereinabove, the present disclosure has been described with reference to various exemplary embodiments. It should be understood that these exemplary embodiments are merely illustrative examples. A person skilled in the art will understand that various changes and modifications of elements and combinations of processes are possible herein, and such changes and modifications are also within the scope of the present disclosure. Accordingly, the description and drawings herein should be interpreted only as illustrative and not restrictive.

The present disclosure makes it possible to manufacture a housing that provides sufficient strength and also achieves weight reduction. The housing may be used suitably for various types of electronic devices.

What is claimed is:

1. A housing comprising a metal plate including a molded plastic part, the housing being formed by bending the metal plate including the molded plastic part,
    wherein the molded plastic part includes:
    a perimeter portion located along an outer peripheral edge of the metal plate; and
    a bent part located in a region including a bending area at which the metal plate is bent, and
    the bent part is provided with a notch located along the bending area,
    wherein the metal plate includes:
    a printed circuit board (PCB) contact part to be contactable with a substrate on which electronic components are mounted;

a main part; and a biasing portion extending from the main part to the PCB contact part, the biasing portion being configured to exert a biasing force the substrate toward the PCB contact part; and the molded plastic part includes:

a first portion disposed on a first surface of the biasing portion and extending from an intermediate portion of the biasing portion toward the PCB contact part; and a second portion disposed on a second surface of the biasing portion and extending from the intermediate portion toward the metal plate.

2. The housing according to claim 1, wherein the metal plate is exposed along the bending area in the bent part.

3. The housing according to claim 1, wherein the notch has a V-shape of which width increases away from the metal plate.

4. The housing according to claim 1, wherein the molded plastic part includes a substrate-securing portion to secure the substrate on which the electronic components are mounted; and the metal plate includes the printed circuit board (PCB) contact part to be contact with the substrate secured to the substrate-securing portion.

5. The housing according to claim 1, wherein the molded plastic part includes a pair of fastening pieces engaged with each other in a state where the metal plate is bent.

6. An electronic device comprising:

the housing according to claim 1; and a circuit board secured to the housing.

7. A method for manufacturing the housing according to claim 1, the method comprising:

disposing a metal plate material into a metal mold, the metal plate material including the PCB contact part and the biasing portion;

bending the biasing portion by closing the metal mold; and in the metal mold, supplying a resin material to a region around the biasing portion that has been bent, to mold the first portion and the second portion.

* * * * *